US012580011B2

(12) United States Patent
Crafton et al.

(10) Patent No.: US 12,580,011 B2
(45) Date of Patent: Mar. 17, 2026

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Brian Crafton, Hsinchu (TW); Xiaochen Peng, Hsinchu (TW); Murat Kerem Akarvardar, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/739,767

(22) Filed: Jun. 11, 2024

(65) Prior Publication Data

US 2025/0378860 A1    Dec. 11, 2025

(51) Int. Cl.
G11C 7/10       (2006.01)
G06F 7/523      (2006.01)

(52) U.S. Cl.
CPC ............ G11C 7/1069 (2013.01); G06F 7/523 (2013.01); G11C 7/1012 (2013.01)

(58) Field of Classification Search
CPC ...... G11C 7/1069; G11C 7/1012; G06F 7/523

USPC .................................................. 365/189.011
See application file for complete search history.

(56) References Cited

U.S. PATENT DOCUMENTS

2023/0418557 A1* 12/2023 Lee ........................... G06F 7/49
2023/0418738 A1   12/2023 Linnen et al.

FOREIGN PATENT DOCUMENTS

CN        113537453 X       10/2021
CN        116245153         6/2023
CN        116504291         7/2023
TW        202420064         5/2024

* cited by examiner

*Primary Examiner* — Fernando Hidalgo
(74) *Attorney, Agent, or Firm* — Hauptman Ham, LLP

(57)        ABSTRACT

A memory circuit includes a compute in-memory (CIM) array. The CIM array includes a memory cell array configured to store a first set of data. The first set of data including a first set of weights or a second set of data. The first set of data being exponent portions of corresponding floating point numbers. The second set of data being a compressed version of the first set of weights. The first set of weights having a first data length, and the second set of data having a second data length less than the first data length. The CIM array further includes a decoder coupled to the memory cell array, and being configured to generate a first set of output signals in response to a first set of input signals, the first set of data and a flag signal.

20 Claims, 15 Drawing Sheets

Each square is 8 bits
16 squares
L2 = 128 bits

| 0 | 1 | 2 | 3 | 4 | 5 | 6 | 7 | 8 | 9 | 10 | 11 | 12 | 13 | 14 | 15 |

730

730

| Flag | Base | Weight (W) |

712    714    730

1 bits    8 bits    128 bits

720

| Row 1 | Row N+1 |
| Row 2 | |
| ... | |
| Row N | Row 2N |

304

Exponent Memory

700B

MEMORY CIRCUIT AND METHOD OF OPERATING SAME

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
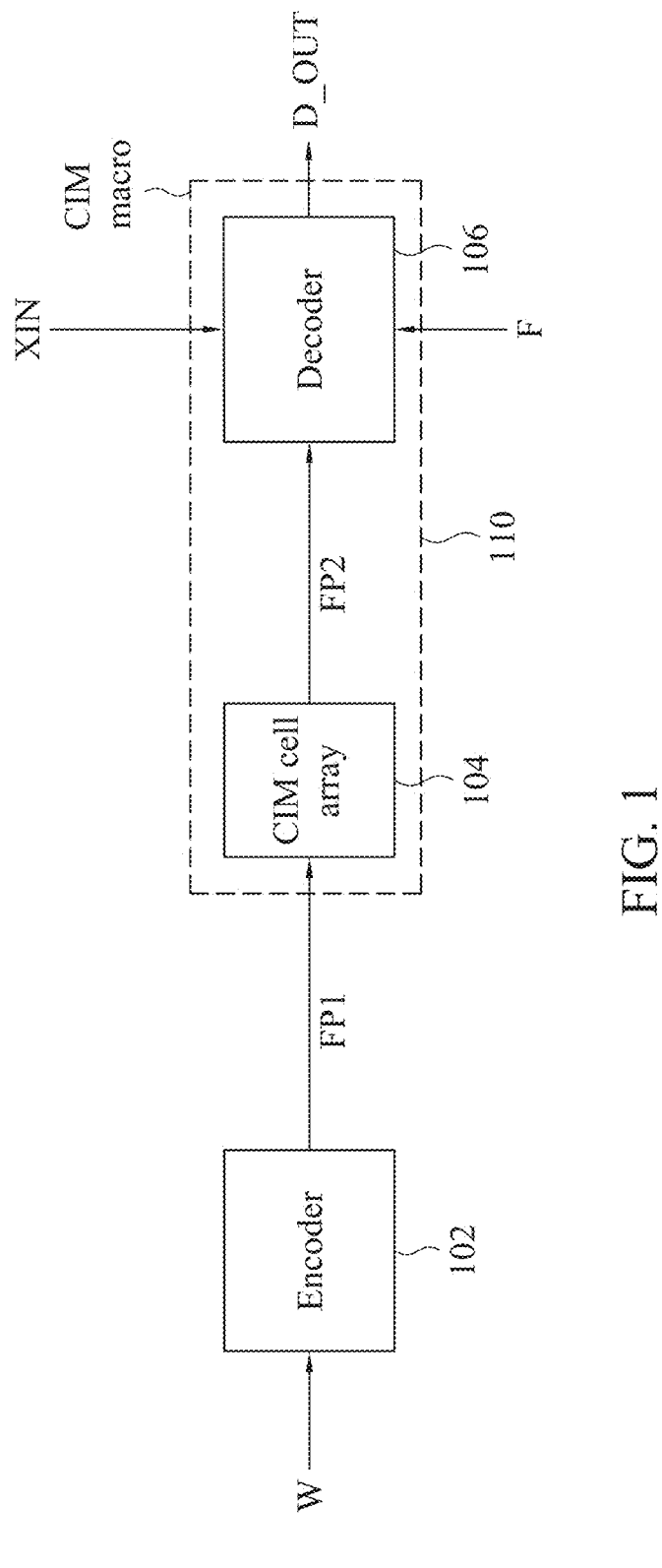
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a compute in-memory (CIM) array.

In some embodiments, the CIM array includes a memory cell array. In some embodiments, the memory cell array is configured to store a first set of data.

In some embodiments, the first set of data includes a first set of weights or a second set of data. In some embodiments, the first set of data is exponent portions of corresponding floating point numbers. In some embodiments, the first set of weights is compressed into the second set of data, where the first set of weights has a first data length, and the second set of data has a second data length less than the first data length.

In some embodiments, the CIM array further includes a decoder coupled to the memory cell array. In some embodiments, the decoder is configured to generate a first set of output signals in response to a first set of input signals, the first set of data and a flag signal. In some embodiments, the decoder is configured to generate the first set of output signals in response to the first set of input signals, the flag signal and at least the first set of weights or the second set of data.

In some embodiments, by compressing the first set of weights into the second set of data, the memory circuit is able to reduce the amount of processing performed by the memory circuit compared to other approaches. In some embodiments, by reducing the amount of processing performed by the memory circuit results in improved power efficiency compared to other approaches with vector multiplier accumulator (MAC) units.

FIG. 1 is a block diagram of a memory circuit 100, in accordance with some embodiments.

Memory circuit 100 includes an encoder 102 and a compute in-memory (CIM) macro 110.

The CIM macro 110 includes a CIM array 104 and a decoder 106.

Encoder 102 is coupled to the CIM array 104. An input of encoder 102 is configured to receive a set of weights W. An output of encoder 102 is configured to output a set of data FP1. In some embodiments, each received signal in the set of weights W has a floating point number format. In some embodiments, each signal in the set of data FP1 has a floating point number format. In some embodiments, the set of weights W includes 16 words, and each word is 8 bits in length. Other number of words or word lengths within the set of weights W is within the scope of the present disclosure.

Encoder 102 is configured to generate the set of data FP1 in response to the set of weights W. In some embodiments, the set of data FP1 includes the set of weights W or a set of deltas D. In some embodiments, each signal in the set of deltas D has a floating point number format. In some embodiments, the set of deltas D includes at least one of a set of deltas D1 or a set of deltas D2. In some embodiments, the set of deltas D is a compressed version of the set of weights W. In some embodiments, at least one of a set of deltas D1 or a set of deltas D2 is a compressed version of the set of weights W.

In some embodiments, the set of weights W includes at least one of a set of weights W1 or a set of weights W2. In some embodiments, the set of deltas D1 is a compressed version of the set of weights W1, and the set of deltas D2 is a compressed version of the set of weights W2.

In some embodiments, the encoder 102 is configured to compress the set of weights W in generating the set of deltas D. In some embodiments, the encoder 102 is configured to compress the set of weights W into at least one of a set of deltas D1 or a set of deltas D2. In some embodiments, compressing a first signal into a second signal includes changing a first size of the first signal into a second size of the second signal. In some embodiments, compressing data includes reducing a size of the data. In some embodiments, a size of the data includes a length of the data. For example, in some embodiments, the set of weights W includes a data length L2, and the set of deltas D1 or D2 includes a data length L1. In these embodiments, the data length L1 is less than the data length L2. Stated differently, since the data length L1 is less than the data length L2, then the set of deltas D1 or D2 is compressed with respect to the set of weights W. In some embodiments, encoder 102 is also referred to as a compressor.

In some embodiments, the set of deltas D1 or D2 is exponent portions of corresponding floating point numbers.

In some embodiments, the set of deltas D includes 32 words, and each word is 4 bits in length. Other number of words or word lengths within the set of deltas D is within the scope of the present disclosure.

In some embodiments, the set of deltas D1 includes 16 words, and each word is 4 bits in length, and the set of deltas D2 includes 16 words, and each word is 4 bits in length. Other number of words or word lengths within the set of deltas D1 or D2 is within the scope of the present disclosure.

In some embodiments, if the set of data FP1 is equal to the set of weights W, then the encoder 102 is configured to pass (e.g., does not compress) the set of weights W as the set of data FP1.

Other configurations of encoder 102 are within the scope of the present disclosure.

CIM array 104 is coupled to an output of encoder 102, and an input of decoder 106. An input of CIM array 104 is coupled to the output of encoder 102. An output of CIM array 104 is coupled to an input of decoder 106. In some embodiments, CIM array 104 includes a memory cell array coupled to one or more computation/multiplication blocks (shown in FIG. 3).

The memory cell array in CIM array 104 is configured to store the set of signals FP1. CIM array 104 is configured to generate a set of signals FP2 in response to the set of signals FP1. In some embodiments, the set of signals FP2 is the same as the set of signals FP1. In some embodiments, the set of data FP2 includes the set of weights W or the set of deltas D. In some embodiments, each signal in the set of data FP2 has a floating point number format.

Figure 3:
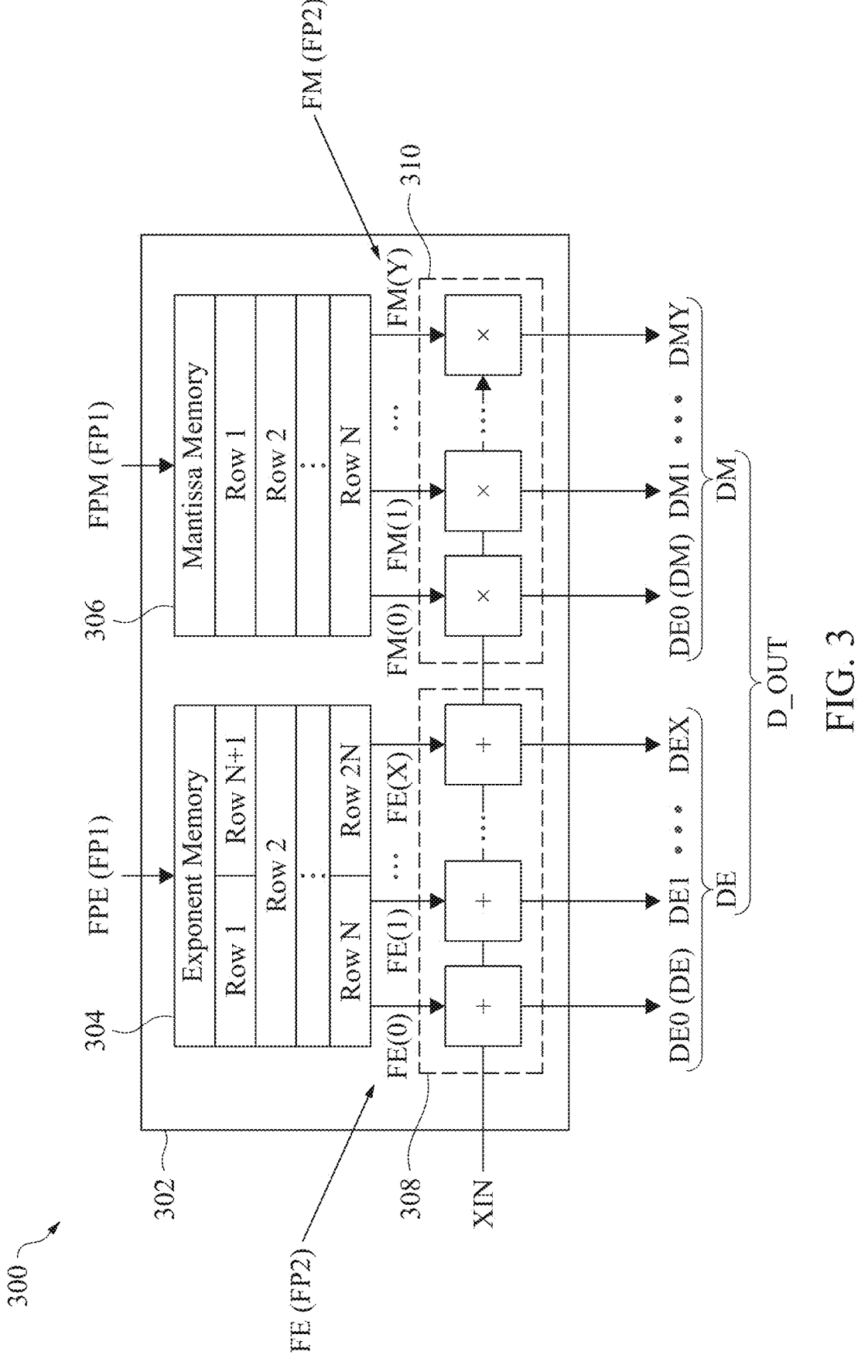
FIG. 3 is a block diagram of a memory circuit, in accordance with some embodiments.

In some embodiments, the set of signals FP1 includes a set of exponent signals FPE (shown in FIG. 3) and a set of mantissa signals FME (shown in FIG. 3). In some embodiments, the set of signals FP2 includes a set of exponent signals FE (shown in FIG. 3) and a set of mantissa signals FM (shown in FIG. 3). In some embodiments, the set of exponent signals FE is equal to the set of exponent signals FPE. In some embodiments, the set of mantissa signals FM is equal to the set of mantissa signals FME.

Other configurations or formats for at least the set of signals FP2 are within the scope of the present disclosure.

In some embodiments, the memory cell array in CIM array 104 is a volatile memory cell array including volatile memory cells. In some embodiments, each memory cell in the memory cell array of CIM array 104 corresponds to a static random-access memory (SRAM) cell. In some embodiments, each memory cell in the memory cell array of CIM array 104 corresponds to a dynamic random-access memory (DRAM) cell.

In some embodiments, memory cell array 102 is a non-volatile memory cell array including non-volatile memory cells. In some embodiments, each memory cell in the memory cell array of CIM array 104 corresponds to a magnetoresistive random-access memory (MRAM) cell. In some embodiments, each memory cell in the memory cell array of CIM array 104 corresponds to a phase-change memory (PCM) cell. In some embodiments, each memory cell in the memory cell array of CIM array 104 corresponds to a phase-change RAM (PRAM) cell. In some embodiments, each memory cell in the memory cell array of CIM array 104 corresponds to a Ferroelectric RAM (FeRAM) cell. In some embodiments, each memory cell in the memory cell array of CIM array 104 corresponds to a Ferroelectric Field Effect Transistor (FeFET) cell.

Other configurations or other types of memory cells in the memory cell array of CIM array 104 are within the scope of the present disclosure.

CIM array 104 and decoder 106 are part of memory macro 110. In some embodiments, memory macro 110 is configured to perform vector multiplication of the set of data FP1 with the set of input signals XIN. In some embodiments, memory macro 110 performs one or more multiply-accumulate (MAC) operations.

In some embodiments, memory circuit 100 is part of a neural network, and the set of input signals XIN corresponds to an input vector, the set of signals FP2 corresponds to weight vectors, and the memory macro 110 is configured to multiply the input vector by the weight vectors, thereby generating the set of output signals D_OUT.

In some embodiments, the input vector corresponds to data values based on the application type in one or more neural networks. In some embodiments, the weight vector corresponds to values of one or more trained filter coefficients within a particular layer of the one or more neural networks.

Other configurations of CIM array 104 are within the scope of the present disclosure.

Decoder 106 is coupled to CIM array 104. A first input of decoder 106 is configured to receive the set of signals FP2. A second input of decoder 106 is configured to receive the set of input signals XIN. A third input of decoder 106 is configured to receive a flag signal F. An output of decoder 106 is configured to output a set of output signals D_OUT.

Decoder 106 is configured to generate the set of output signals D_OUT in response to at least one of the set of signals FP2, the set of input signals XIN or the flag signal F. In some embodiments, the set of output signals D_OUT have the floating point number format.

In some embodiments, decoder 106 is configured to de-compress the set of signals FP2, and to perform at least one of addition or multiplication of the de-compressed set of signals FP2 with the set of input XIN.

In some embodiments, the flag signal F is useable by the decoder 106 to determine whether to decompress the set of delta signals D in generating the set of output signals D_OUT or whether to use the set of weights W in generating the set of output signals D_OUT.

In some embodiments, de-compressing a signal is the inverse of compressing the signal performed by encoder 102. In some embodiments, de-compressing the first signal into the second signal includes changing a length of the first signal into a length of the second signal. For example, in some embodiments, decoder 106 is configured to change a length of the first set of deltas D1 or the second set of deltas D2 to a length of the set of weights W. In some embodiments, decoder 106 is also referred to as a de-compressor.

Other configurations of decoder 106 are within the scope of the present disclosure.

In some embodiments, two or more of at least encoder 102, CIM array 104 or decoder 106 are combined into a single circuit.

In some embodiments, by compressing the set of weights W into the set of deltas D, the memory macro 110 is able to reduce the amount of processing performed by the memory macro 110 compared to other approaches. In some embodiments, reducing the amount of processing performed by the memory macro 110 results in improved power efficiency compared to other approaches with vector multiplier accumulator (MAC) units.

In some embodiments, by compressing the set of weights W into the set of deltas D, the CIM array 104 is able to utilize less memory resources thereby increasing memory capacity of CIM array 104 compared to other approaches.

In some embodiments, by compressing the set of weights W into the set of deltas D, the CIM array 104 is able to reduce a number of memory accesses to one or more external buffers compared to other approaches.

In some embodiments, by decompressing the set of deltas D, which are exponents of floating point numbers, the decoder 106 is able to perform decompression of data by utilizing less logic resources than other approaches, thereby decreasing energy utilized to perform decompression compared to other approaches.

Other configurations or number of elements in memory circuit 100 are within the scope of the present disclosure.

Figure 2:
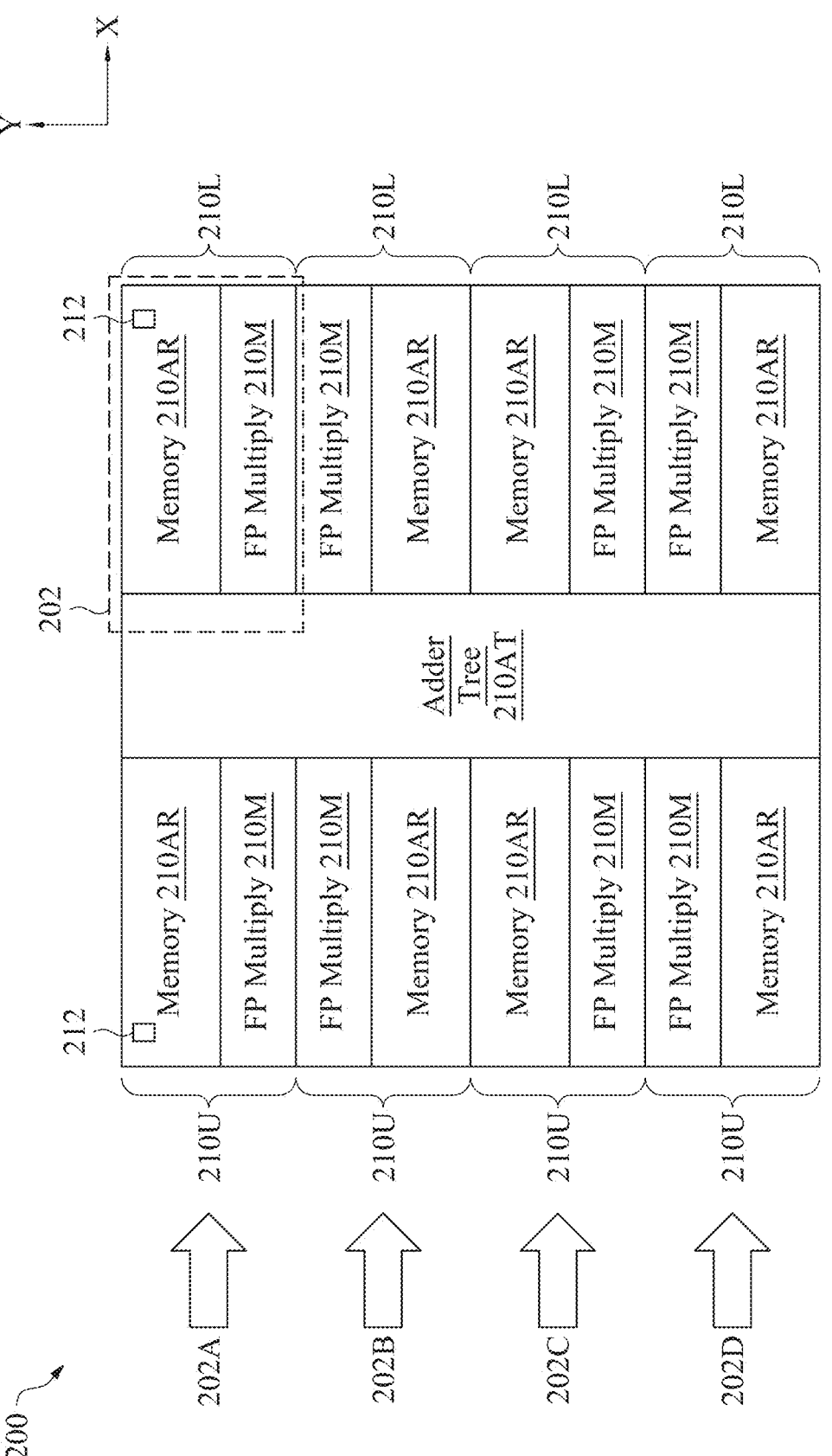
FIG. 2 is a block diagram of a memory circuit, in accordance with some embodiments.

FIG. 2 is a block diagram of a memory circuit 200, in accordance with some embodiments.

FIG. 2 is simplified for the purpose of illustration. In some embodiments, memory circuit 200 includes various elements in addition to those depicted in FIG. 2 or is otherwise arranged to perform the operations discussed below.

Memory circuit 200 is an embodiment of memory macro 110, and similar detailed description is therefore omitted.

Memory circuit 200 is an integrated circuit (IC) that includes memory partitions 202A-202D and an adder tree 210AT.

Each memory partition 202A-202D includes memory banks 210U and 210L. The memory banks 210U and 210L are adjacent to the adder tree 210AT.

Each memory bank 210U and 210L includes a memory cell array 210AR and a floating point (FP) multiply circuit 210M.

In some embodiments, memory banks 210U and 210L and adder tree 210AT are an embodiment of memory macro 110, and similar detailed description is therefore omitted. In some embodiments, adder tree 210AT is an embodiment of decoder 106, and similar detailed description is therefore omitted. In some embodiments, memory cell array 210AR is an embodiment of CIM array 104, and similar detailed description is therefore omitted.

A memory partition, e.g., a memory partition 202A-202D, is a portion of memory circuit 200 that includes a subset of memory devices (not shown in FIG. 2) and adjacent circuits configured to selectively access the subset of memory devices in program and read operations. In the FIG. 2 embodiment, memory circuit 200 includes a total of four partitions. In some embodiments, memory circuit 200 includes a total number of partitions greater or fewer than four.

Each memory bank 210U and 210L includes the corresponding memory cell array 210AR including memory cells or memory devices 212 configured to be accessed in program and read operations by adjacent local input output (LIO) circuits (not shown).

Each memory cell array 210AR includes an array of memory devices 212 having N rows and M columns, where M and N are positive integers. The rows of cells in memory cell array 202 are arranged in a first direction X. The columns of cells in memory cell array 202 are arranged in a second direction Y. The second direction Y is different from the first direction X. In some embodiments, the second direction Y is perpendicular to the first direction X. In some embodiments, each memory cell array 210AR is divided into an upper region and a lower region (not shown). In some embodiments, each column of memory devices 212 in memory cell array 210AR is coupled to a corresponding FP multiply circuit 210M and the corresponding adder tree 210AT.

Memory device 212 is shown in memory bank 210U and 210L of memory partition 202A. For case of illustration, memory device 212 is not shown in memory bank 210U and 210L of memory partitions 202B, 202C and 202D.

Memory device 212 is an electrical, electromechanical, electromagnetic, or other device configured to store bit data represented by logical states. At least one logical state of memory device 212 is capable of being programmed in a write operation and detected in a read operation. In some embodiments, a logical state corresponds to a voltage level of an electrical charge stored in a given memory device 212. In some embodiments, a logical state corresponds to a physical property, e.g., a voltage, a current, a resistance or a magnetic orientation, of a component of a given memory device 212.

In some embodiments, memory device 212 includes one or more single port (SP) static random access memory (SRAM) cells. In some embodiments, memory device 212 includes one or more dual port (DP) SRAM cells. In some embodiments, memory device 212 includes one or more multi-port SRAM cells. Different types of memory cells in memory device 212 are within the contemplated scope of the present disclosure. In some embodiments, memory device 212 includes one or more dynamic random access memory (DRAM) cells. In some embodiments, memory device 212 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 212 is an OTP memory device including one or more OTP memory cells.

In some embodiments, each FP multiply circuit 210M is configured to perform multiplication between the set of input signals XIN (FIG. 1) and the set of weights W (FIG. 1). In some embodiments, each FP multiply circuit 210M includes one or more multipliers (e.g., set of multipliers 310 in FIG. 3).

In some embodiments, the adder tree 210AT is configured to perform addition between the set of input signals XIN (FIG. 1) and the set of weights W (FIG. 1). In some embodiments, the adder tree 210AT includes one or more adders (e.g., set of adders 308 in FIG. 3).

A region 202 is a portion of memory circuit 200. In some embodiments, region 202 includes a portion of adder tree 210AT, FP multiply circuit 210M and memory cell array 210AR.

Other configurations of memory circuit 200 are within the scope of the present disclosure.

FIG. 3 is a block diagram of a memory circuit 300, in accordance with some embodiments.

FIG. 3 is simplified for the purpose of illustration. In some embodiments, memory circuit 300 includes various elements in addition to those depicted in FIG. 3 or is otherwise arranged to perform the operations discussed below.

Memory circuit 300 is an embodiment of region 202 of FIG. 2, and similar detailed description is therefore omitted.

Memory circuit 300 includes a memory macro 302.

Memory macro 302 includes a memory array 304, a memory array 306, a set of adders 308 and a set of multipliers 310.

In some embodiments, memory array 304 is an embodiment of a first portion of memory cell array 210AR of FIG. 2, and memory array 306 is an embodiment of a second portion of memory cell array 210AR of FIG. 2, and similar detailed description is therefore omitted.

In some embodiments, the set of adders 308 is an embodiment of the adder tree 210AT of FIG. 2, and the set of multipliers 310 is an embodiment of the FP multiply circuit 210M of FIG. 2, and similar detailed description is therefore omitted.

In some embodiments, at least one of memory array 304 or 306 is an embodiment of CIM array 104 of FIG. 1, and similar detailed description is therefore omitted. In some embodiments, at least one of the set of adders 308 or the set of multipliers 310 is an embodiment of the decoder 106 of FIG. 1, and similar detailed description is therefore omitted.

Memory array 304 is coupled to the set of adders 308. Memory array 304 is configured to receive or store the set of exponent signals FPE. In some embodiments, the set of exponent signals FPE is the exponent portion of the set of signals FP1.

Memory array 304 includes rows of memory cells ranging from N rows to 2*N rows, where N is an integer corresponding to a number of rows in memory array 306. In some embodiments, if the set of signals FP1 were compressed by the encoder 102, then a single row of memory cells in memory array 304 is configured to store the first set of deltas D1 and the second set of deltas D2 in corresponding row "Row 1" and "Row N+1". Stated differently, in some embodiments, when the set of signals FP1 are compressed by the encoder 102, then row "Row 1" of memory cells in memory array 304 is configured to store the first set of deltas D1, and row "Row N+1" of memory cells in memory array 304 is configured to store the second set of deltas D2.

During a read operation of memory array 304, memory array 304 is configured to output a set of exponent signals FE. In some embodiments, the set of exponent signals FE correspond to the set of exponent signals FPE. In some embodiments, the set of exponent signals FE is equal to the set of exponent signals FPE.

In some embodiments, the set of exponent signals FE includes one or more of exponent signals FE(0), FE(1), . . . , FE(X), where X is an integer corresponding to a number of signals in the set of exponent signals FM.

In some embodiments, the set of exponent signals FE include a first set of exponent signals FE1 (not labelled) and a second set of exponent signals FE2 (not labelled). In some embodiments, the first set of exponent signals FE1 is the set of deltas D1. In some embodiments, the second set of exponent signals FE2 is the set of deltas D2.

In some embodiments, the set of exponent signals FE corresponds to a portion of a single row. For example, in some embodiments, the set of deltas D1 are stored in Row 1 of memory array 304, and the set of deltas D2 are stored in Row N+1 of memory array 304.

Other configurations in memory array 304 are within the scope of the present disclosure.

Memory array 306 is coupled to the set of multipliers 310. Memory array 306 is configured to receive or store the set of mantissa signals FPM. In some embodiments, the set of mantissa signals FPM is the mantissa portion of the set of signals FP1.

Memory array 306 includes N rows of memory cells, where N is an integer corresponding to a number of rows in memory array 306. In some embodiments, a single row of memory cells in memory array 306 is configured to store the set of mantissa signals FPM.

During a read operation of memory array 306, memory array 306 is configured to output a set of mantissa signals FM. In some embodiments, the set of mantissa signals FM correspond to the set of mantissa signals FPM. In some embodiments, the set of mantissa signals FM is equal to the set of mantissa signals FPM.

In some embodiments, the set of mantissa signals FM includes one or more of mantissa signals FM(0), FM(1), . . . , FM (Y), where Y is an integer corresponding to a number of signals in the set of mantissa signals FM. In some embodiments, the integer Y is different from integer X. In some embodiments, the integer Y is the same as integer X.

In some embodiments, the set of mantissa signals FM include a first set of mantissa signals FM1 (not labelled) and a second set of mantissa signals FM2 (not labelled). In some embodiments, the first set of mantissa signals FM1 corresponds to the first set of exponent signals FE1. In some embodiments, the second set of mantissa signals FM2 corresponds to the second set of exponent signals FE2.

In some embodiments, the set of mantissa signals FM corresponds to a single row of memory array 306. In some embodiments, the set of mantissa signals FM corresponds to more than a single row of memory array 306.

Other configurations in memory array 306 are within the scope of the present disclosure.

The set of adders 308 is coupled to the memory array 304 and the set of multipliers 310.

The set of adders 308 is configured to generate a set of exponent output signals DE in response to the set of input signals XIN and the set of exponent signals FE. In some embodiments, the set of exponent output signals DE is a sum of the set of input signals XIN and the set of exponent signals FE.

A first input of the set of adders 308 is configured to receive the set of input signals XIN.

A set of second inputs of the set of adders 308 is configured to receive the set of exponent signals FE. The set of second inputs of the set of adders 308 is coupled to the memory array 304. Each input of the set of second inputs of the set of adders 308 is configured to receive a corresponding exponent signal FE(0), FE(1), . . . , FE(X) of the set of exponent signals FE. In some embodiments, each input of the set of second inputs of the set of adders 308 is configured to receive a corresponding exponent signal FE(0), FE(1), . . . , FE(X) of the set of exponent signals FE from a corresponding memory cell in memory array 304.

A set of outputs of the set of adders 308 is configured to output or generate the set of output exponent signals DE. Each output of the set of outputs of the set of adders 308 is configured to output or generate a corresponding output exponent signal DE(0), DE(1), . . . , DE(X) of a set of output exponent signals DE.

In some embodiments, the output exponent signal DE(0), DE(1), . . . , DE(X) of the set of output exponent signals DE is equal to a sum of a corresponding input signal of the set of input signals XIN and a corresponding exponent signal FE(0), FE(1), . . . , FE(X) of the set of exponent signals FE.

The set of multipliers 310 is coupled to the memory array 306 and the set of adders 308.

The set of multipliers 310 is configured to generate a set of mantissa output signals DM in response to the set of input signals XIN and the set of mantissa signals FM. In some embodiments, the set of mantissa output signals DM is a product of the set of input signals XIN and the set of mantissa signals FM.

A first input of the set of multipliers 310 is configured to receive the set of input signals XIN.

A set of second inputs of the set of multipliers 310 is configured to receive the set of mantissa signals FM. The set of second inputs of the set of multipliers 310 is coupled to the memory array 306. Each input of the set of second inputs of the set of multipliers 310 is configured to receive a corresponding mantissa signal FM(0), FM(1), . . . , FM(Y) of the set of mantissa signals FM. In some embodiments, each input of the set of second inputs of the set of multipliers 310 is configured to receive a corresponding mantissa signal FM(0), FM(1), . . . , FM(Y) of the set of mantissa signals FM from a corresponding memory cell in memory array 306.

A set of outputs of the set of multipliers 310 is configured to output or generate the set of output mantissa signals DM. Each output of the set of outputs of the set of multipliers 310 is configured to output or generate a corresponding output mantissa signal DM(0), DM(1), . . . , DM(Y) of a set of output mantissa signals DM.

In some embodiments, the output mantissa signal DM(0), DM(1), . . . , DM(Y) of the set of output mantissa signals DM is equal to a product of a corresponding input signal of the set of input signals XIN and a corresponding mantissa signal FM(0), FM(1), . . . , FM(Y) of the set of mantissa signals FM.

In some embodiments, the set of output signals D_OUT includes the set of output exponent signals DE and the set of output mantissa signals DM.

In some embodiments, at least one of the output of the set of adders 308 or an output of the set of multipliers 310 is coupled to an accumulator (not shown).

Other configurations of memory circuit 300 are within the scope of the present disclosure.

Figure 4:
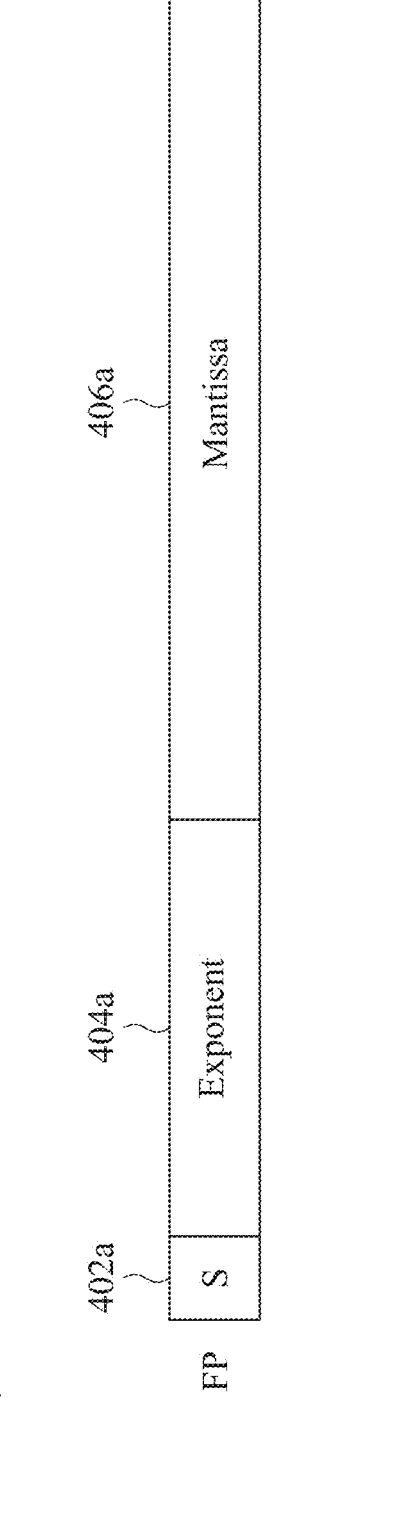
FIG. 4 is a diagram of a number, in accordance with some embodiments.

FIG. 4 is a diagram of a number 400, in accordance with some embodiments.

Number 400 is an embodiment of at least a received signal of the set of received signals FP1 or FP2 of FIG. 1, and similar detailed description is therefore omitted.

Components that are the same or similar to those in one or more of FIGS. 1-9C are given the same reference numbers, and detailed description thereof is thus omitted.

Number 400 is a floating point number with base 2. Number 400 includes a sign 402a, an exponent 404a and a mantissa 406a. The sign 402a corresponds to the sign of the floating point number (e.g., number 400). The exponent 404a corresponds to the exponent of the floating point number (e.g., number 400). The mantissa 406a corresponds to the mantissa of the floating point number (e.g., number 400).

In some embodiments, number 400 corresponds to one or more floating point numbers of the present application. In some embodiments, sign 402a corresponds to one or more signs of the present application. In some embodiments, exponent 404a corresponds to one or more exponents of the present application. In some embodiments, mantissa 406a corresponds to one or more mantissas of the present application.

In some embodiments, the floating-point number format of number 400 includes a half precision (e.g., a "FP16 format"). In some embodiments, FP16 includes 16 bits. Other floating-point number formats for number 400 are within the scope of the present disclosure. For example, in some embodiments, the floating-point number format of number 400 includes one or more of 32-bit, 64-bit, 128-bit, 256-bit floating-point format. In some embodiments, the floating-point number format of number 400 includes one or more floating-point formats in Institute of Electrical and Electronics Engineers (IEEE)-754. In some embodiments, the floating-point number format of number 400 includes one or more of FP8(E4M3), FP8(E5M2), FP16(E5M10) or BF16(E8M7).

Other number of bits in the floating point number format for number 400 are within the scope of the present disclosure.

Other types of floating-point number format for number 400 are within the scope of the present disclosure.

Other configurations of number 400 are within the scope of the present disclosure.

Figure 5A:
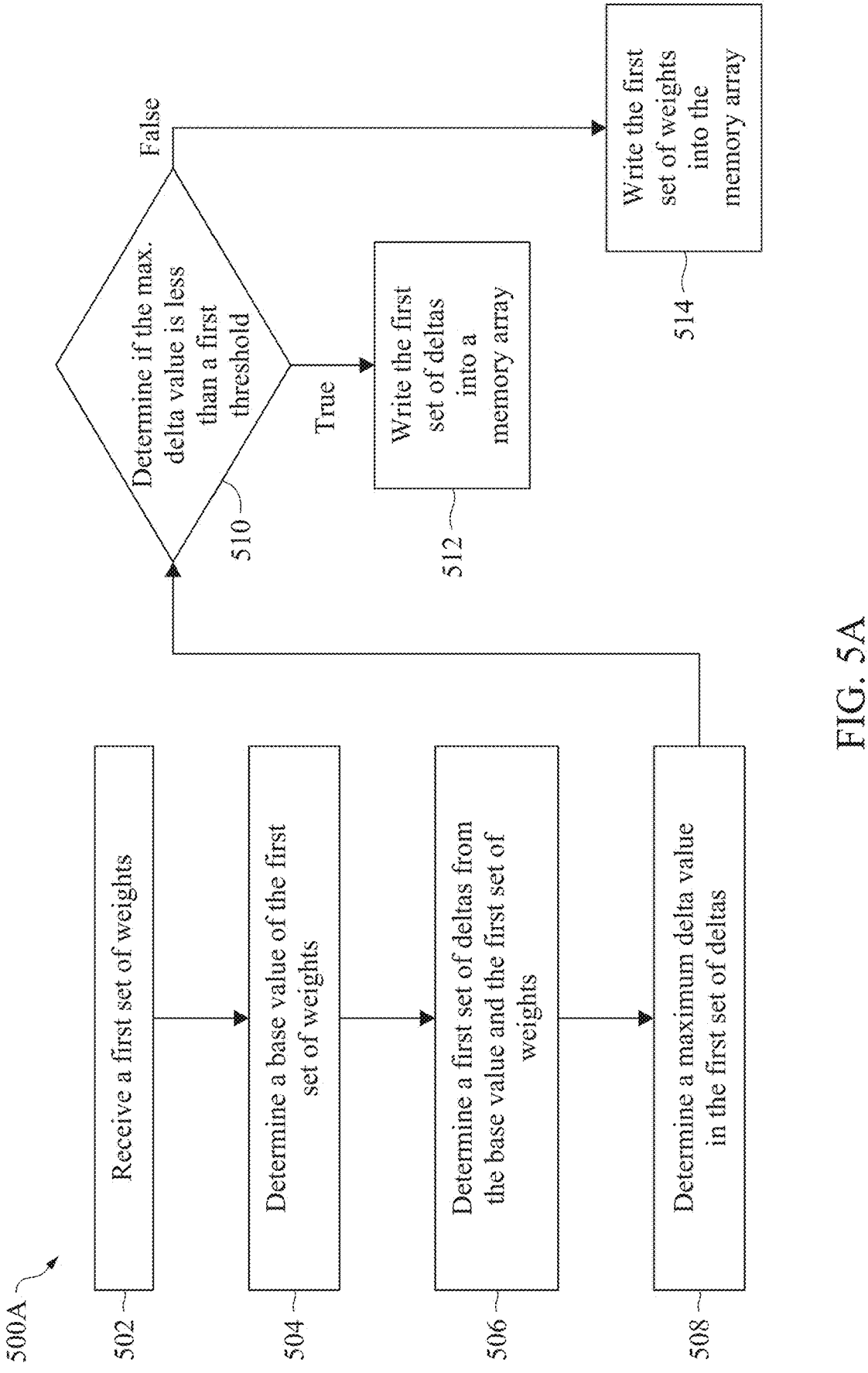
FIG. 5A is a flowchart of a method of operating a memory circuit, in accordance with some embodiments.

FIG. 5A is a flowchart of a method 500A of operating a memory circuit, in accordance with some embodiments.

In some embodiments, FIG. 5A is a flowchart of a method of operating one or more of encoder 102 of FIG. 1. In some embodiments, FIG. 5A is a flowchart of a method of operating memory circuit 100 of FIG. 1 or IC device 900C of FIG. 9C. It is understood that additional operations may be performed before, during, and/or after the method 500A depicted in FIG. 5A, and that some other operations may only be briefly described herein. In some embodiments, other order of operations of method 500A is within the scope of the present disclosure. In some embodiments, one or more operations of method 500A are not performed.

Method 500A includes exemplary operations, but the operations are not necessarily performed in the order shown. Operations may be added, replaced, changed order, and/or eliminated as appropriate, in accordance with the spirit and scope of disclosed embodiments. It is understood that method 500A utilizes features of one or more of encoder 102 of FIG. 1, memory circuit 100 of FIG. 1 or IC device 900 of FIG. 9C.

Figure 5B:
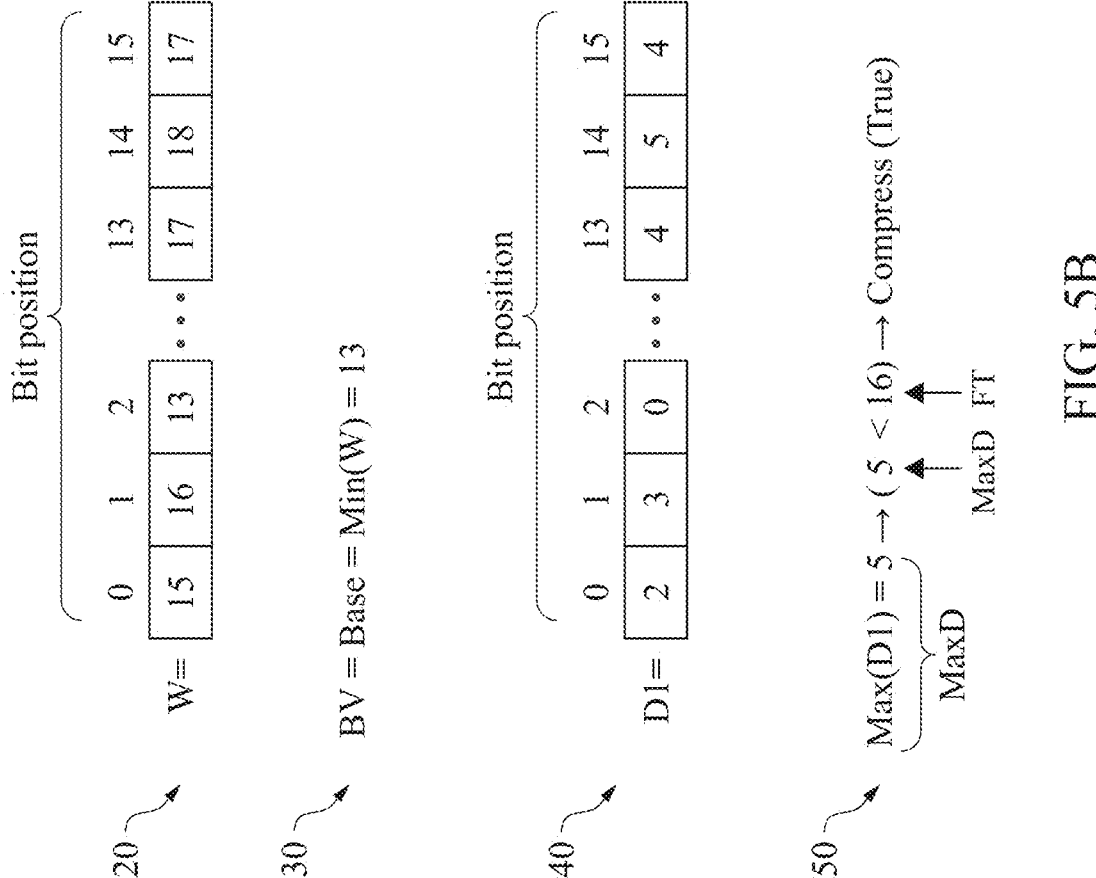
FIG. 5B is a diagram of a graphical illustration of execution of one or more operations of the method of FIG. 5A, in accordance with some embodiments.
Figure 7A:
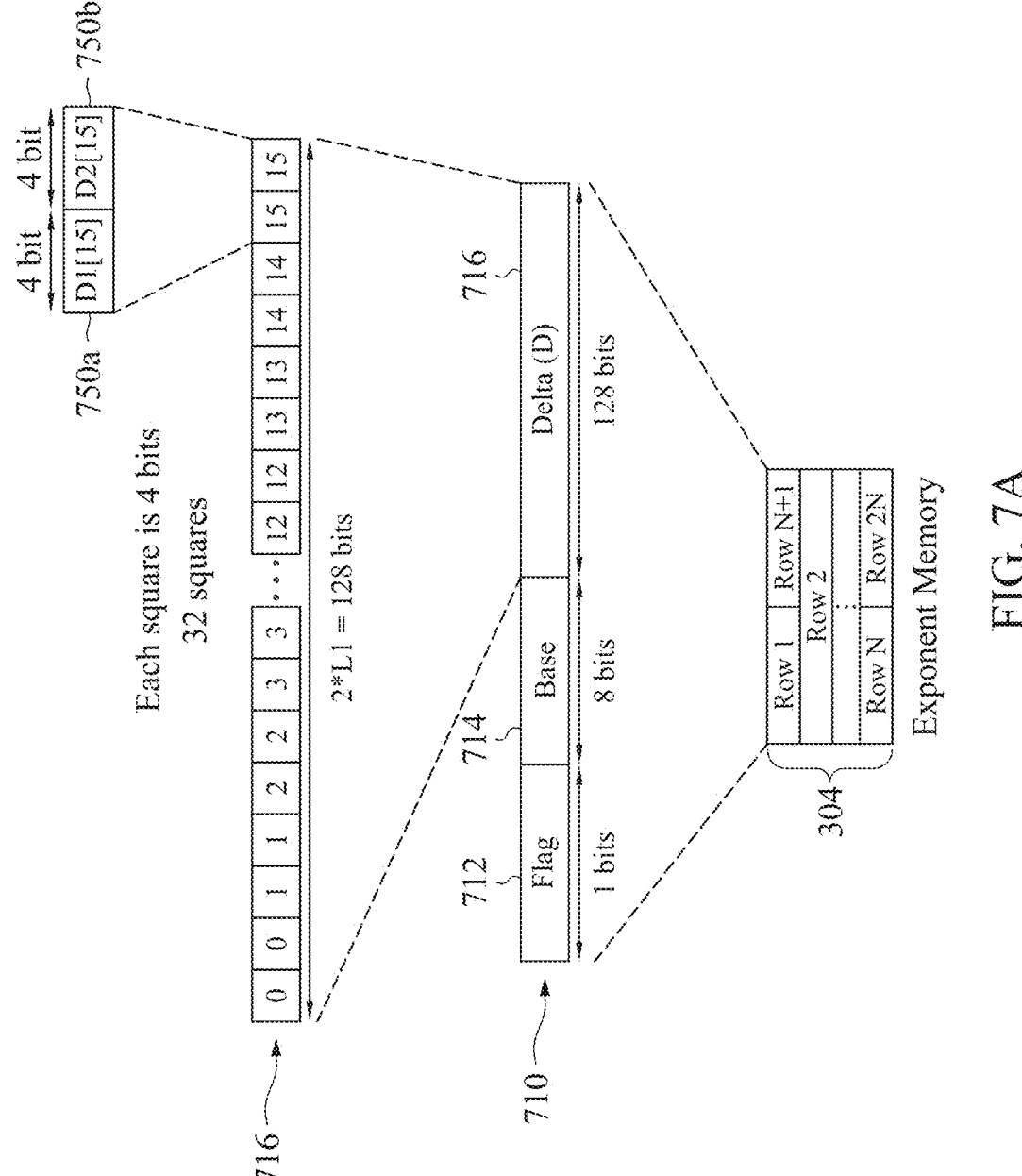
FIGS. 7A-7B is a corresponding block diagram of a corresponding diagram, in accordance with some embodiments.
Figure 7B:
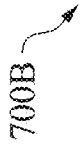
Figure 8A:
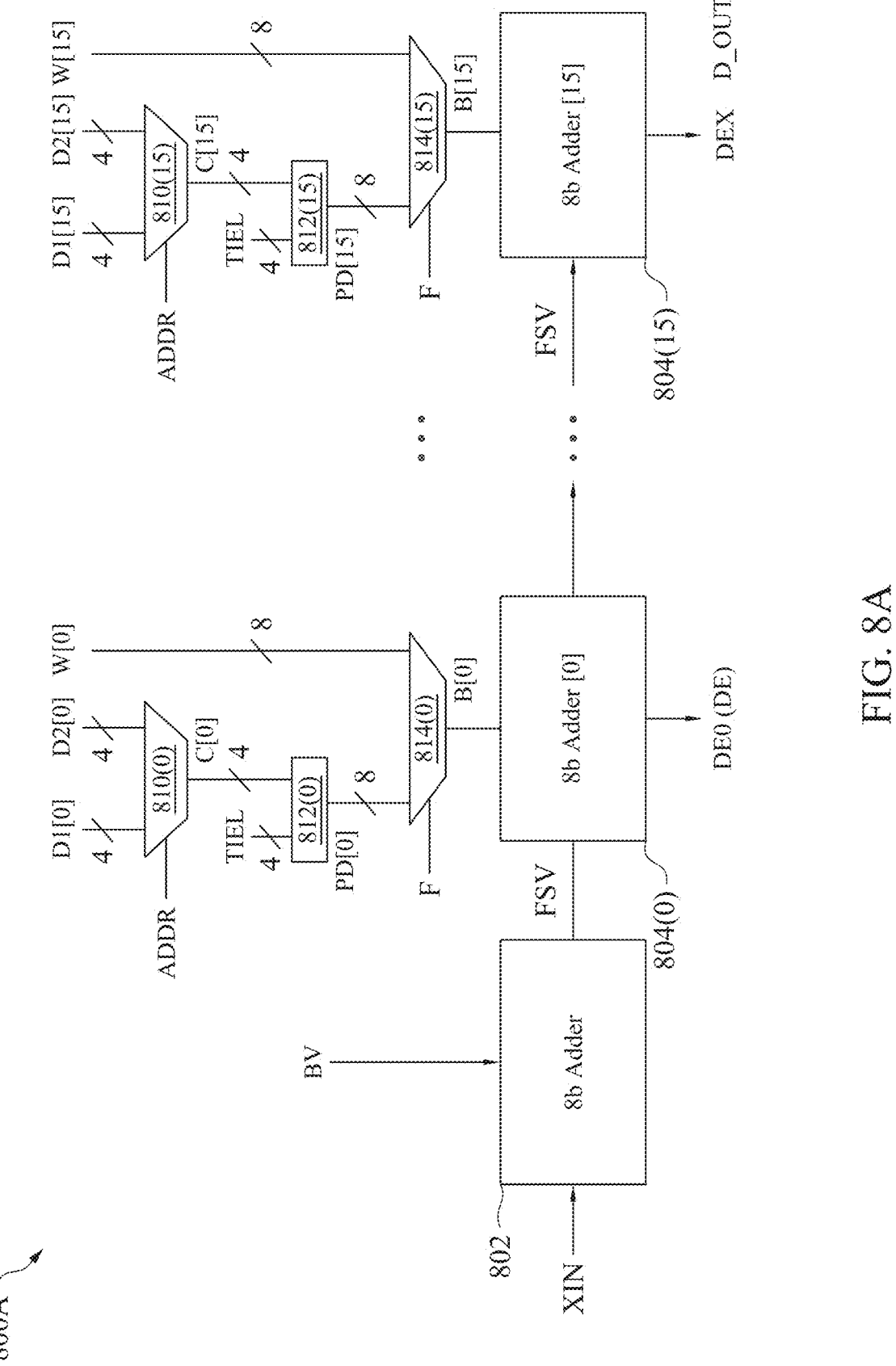
FIG. 8A is a circuit diagram of a decoder circuit, in accordance with some embodiments.
Figure 8B:
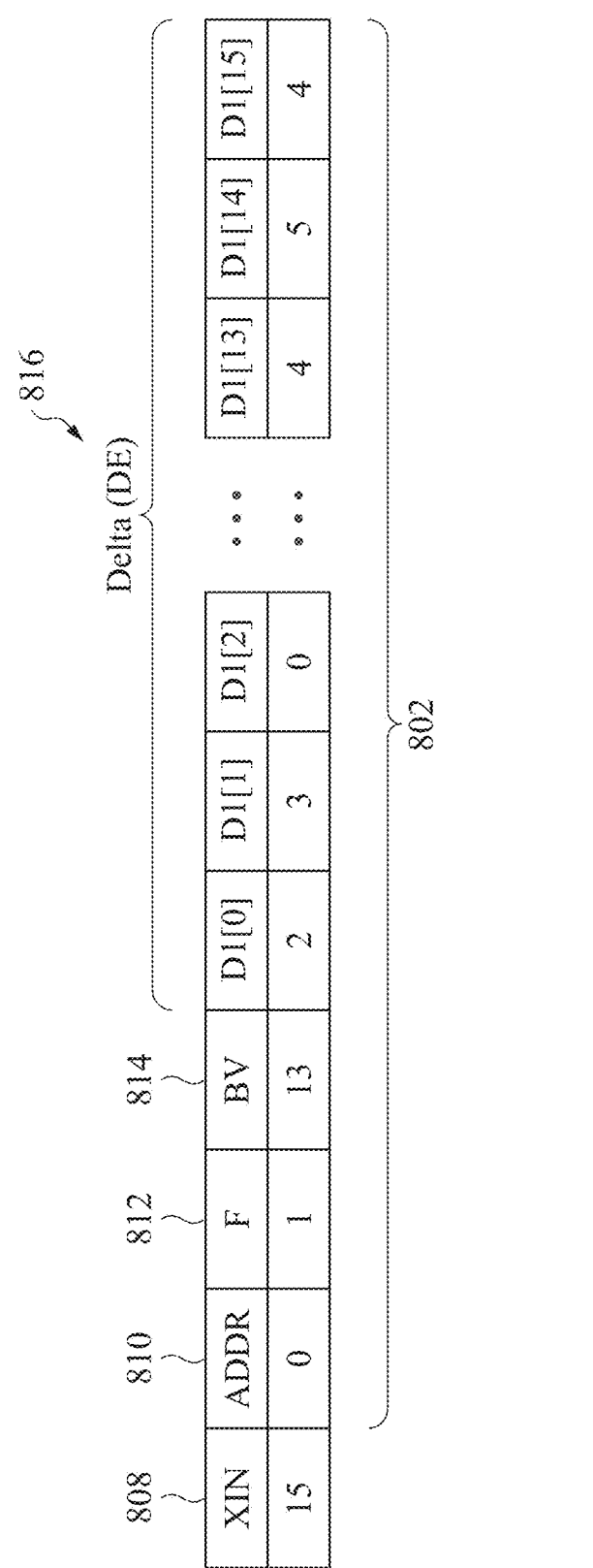
FIG. 8B is a block diagram of a diagram, in accordance with some embodiments.

It is understood that method 500A utilizes features of one or more of memory circuit 200 of FIG. 2, number 400 of FIG. 4, diagram 500B of FIG. 5B, diagram 700A of FIG. 7A, diagram 700B of FIG. 7B or diagram 800B of FIG. 8B.

In some embodiments, method 500A is repeated for each set of weights W. For example, if the set of weights W includes the set of weights W1 and the set of weights W2, then method 500A is performed for the set of weights W1 resulting in the first set of deltas D1 (shown in FIGS. 8A-8C), and method 500A is performed for the set of weights W2 resulting in the second set of deltas D2 (shown in FIGS. 8A-8C).

In operation 502 of method 500A, a first set of weights is received.

In some embodiments, the first set of weights is received by a controller. In some embodiments, the controller of method 500A is processor 932. In some embodiments, the first set of weights is received by an encoder 102.

In some embodiments, the first set of weights of method 500A is shown as a set of weights 520 in FIG. 5B.

In operation 504 of method 500A, a first base value of the first set of weights is determined.

In some embodiments, at least one of operations 504, 506, 508, 510, 512 or 514 is performed by processor 932. In some embodiments, at least one of operations 504, 506, 508, 510, 512 or 514 is performed by hardware (not shown).

In some embodiments, the first base value BV is a minimum value of the first set of weights.

In some embodiments, the first base value BV of method 500A includes a base value 530 in FIG. 5B.

In some embodiments, the first base value BV of method 500A is shown as the first base value 530 in FIG. 5B.

In operation 506 of method 500A, the first set of deltas (D1 or D2) is determined from the first base value of the first set of weights and the first set of weights.

In some embodiments, the first set of deltas of method 500A includes the set of deltas D1 or the set of deltas 540 in FIG. 5B.

Figure 8C:
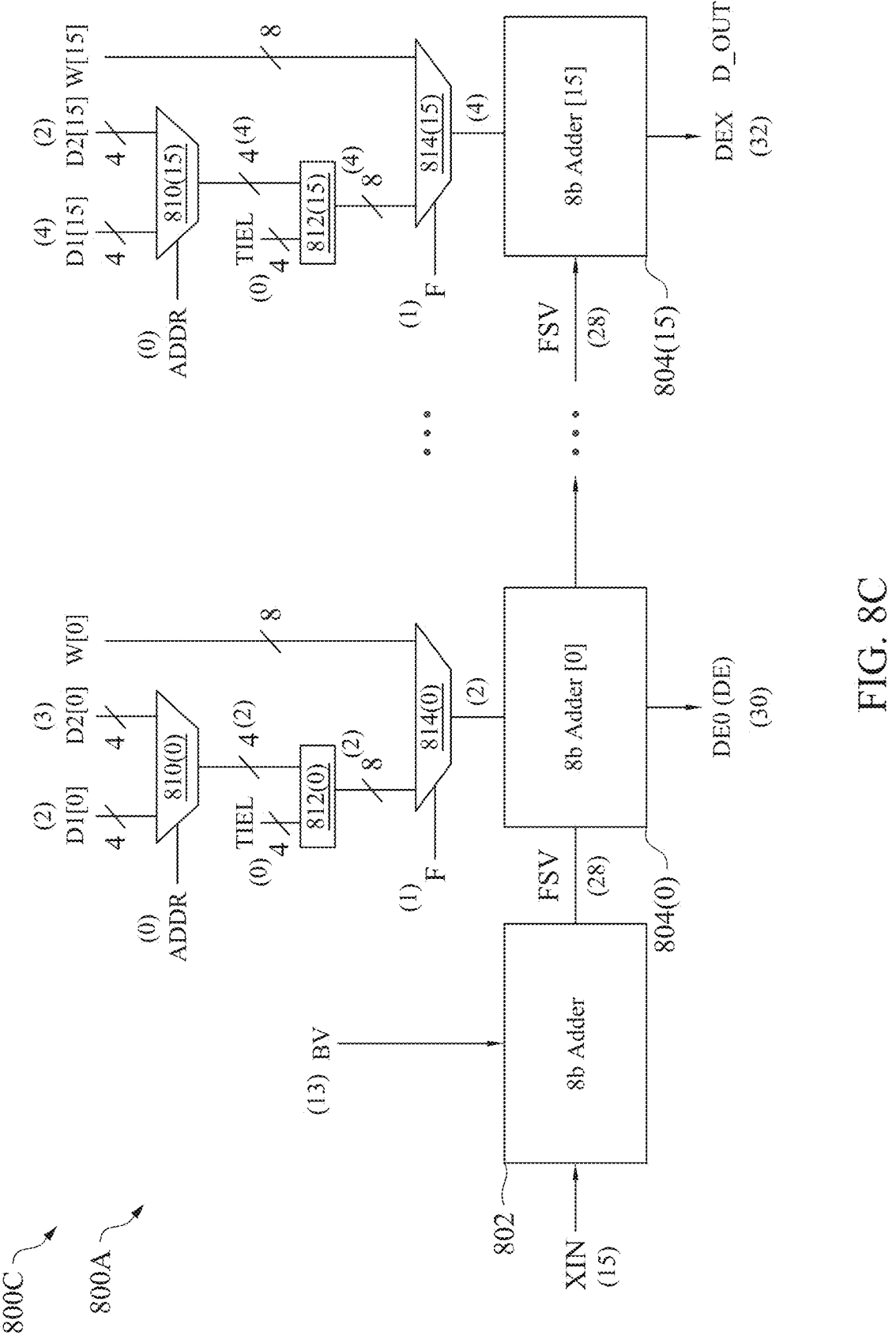
FIG. 8C is a diagram of a graphical illustration of at least part of the method of FIG. 6, in accordance with some embodiments.

In some embodiments, the first set of deltas of method 500A includes the set of deltas D1 or the set of deltas D2 in FIGS. 8A-8C.

In some embodiments, the first set of deltas is equal to a difference between the first base value and the first set of weights.

In some embodiments, the first set of deltas of method 500A is shown as the set of deltas 540 in FIG. 5B.

In operation 508 of method 500A, a maximum delta value MaxD in the first set of deltas is determined.

In some embodiments, the maximum delta value of method 500A is a maximum delta value in the first set of deltas.

In some embodiments, the maximum delta value of method 500A is shown as the maximum delta value Max (D1) in region 550 of FIG. 5B.

In operation 510 of method 500A, a determination is made if the maximum delta value is less than a first threshold FT.

In some embodiments, the first threshold FT of method 500A is a threshold to determine whether to compress the set of weights W into the set of deltas D in FIG. 1.

In some embodiments, the first threshold FT corresponds to a number of words in the set of weights W. For example, in some embodiments, the set of weights W includes 16 words, and each word is 8 bits in length. In these embodiments, the first threshold FT is equal to $2^4$ or 16. In some embodiments, the first threshold FT is less than $2^{(length\ of\ each\ word\ in\ bits/2)}$.

Other number of words or word lengths within the set of weights W is within the scope of the present disclosure.

Other values for the first threshold for the set of weights W are within the scope of the present disclosure.

In some embodiments, the first threshold is selected by a user of IC device 900. In some embodiments, the first threshold is preprogrammed into memory device 934. In some embodiments, the first threshold is dynamically adjusted by the processor 932 or a user of IC device 900.

In some embodiments, if the maximum delta value is less than the first threshold FT, then the result of operation 510 is a "True", and method 500A proceeds to operation 512.

In some embodiments, if the maximum delta value is not less than the first threshold FT, then the result of operation 510 is a "False", and method 500A proceeds to operation 514.

In operation 512 of method 500A, the first set of deltas is written to the memory cell array in response to the maximum delta value MaxD in the first set of deltas being greater than the first threshold FT.

In some embodiments, execution of operation 512 results in the first set of weights being compressed into the first set of deltas.

In operation 514 of method 500A, the first set of weights is written to the memory cell array in response to the maximum delta value MaxD in the first set of deltas being less than the first threshold.

In some embodiments, execution of operation 512 results in the first set of weights not being compressed as the first set of deltas.

By operating at least method 500A, the memory circuit operates to achieve one or more benefits within the present application.

FIG. 5B is a diagram 500B of a graphical illustration of execution of one or more operations of method 500A of FIG. 5A, in accordance with some embodiments.

Diagram 500B includes the set of weights 520, the first base value 530, the set of deltas 540 and region 550.

The set of weights 520 corresponds to the set of weights after operation 502 of method 500A, in accordance with some embodiments.

The first base value 530 corresponds to the first base value after operation 504 of method 500A, in accordance with some embodiments.

The set of deltas 540 corresponds to the first set of deltas 540 after operation 506 of method 500A, in accordance with some embodiments.

The region 550 includes the maximum delta value MaxD, the first threshold FT, and a Compress result field "Compress (True)".

The maximum delta value MaxD corresponds to the maximum delta value MaxD after operation 508 of method 500A, in accordance with some embodiments.

The first threshold FT corresponds to the first threshold FT of operation 510 of method 500A, in accordance with some embodiments.

The compress result field "Compress (True)" corresponds to the result of method 500A after operation 512 of method 500A, in accordance with some embodiments.

In some embodiments, the set of weights 520 is an embodiments of the set of weights W, and similar detailed description is therefore omitted.

In some embodiments, the first set of deltas 540 is an embodiments of the set of deltas D, and similar detailed description is therefore omitted.

Other values in the set of weights 520 or formats for the set of weights 520 are within the scope of the present disclosure.

Other values in the first base value 530 or formats for the first base value 530 are within the scope of the present disclosure.

Other values in the set of deltas 540 or formats for the set of deltas 540 are within the scope of the present disclosure.

Other values in region 550 or formats for region 550 are within the scope of the present disclosure.

Other configurations in diagram 500B are within the scope of the present disclosure.

Figure 6:
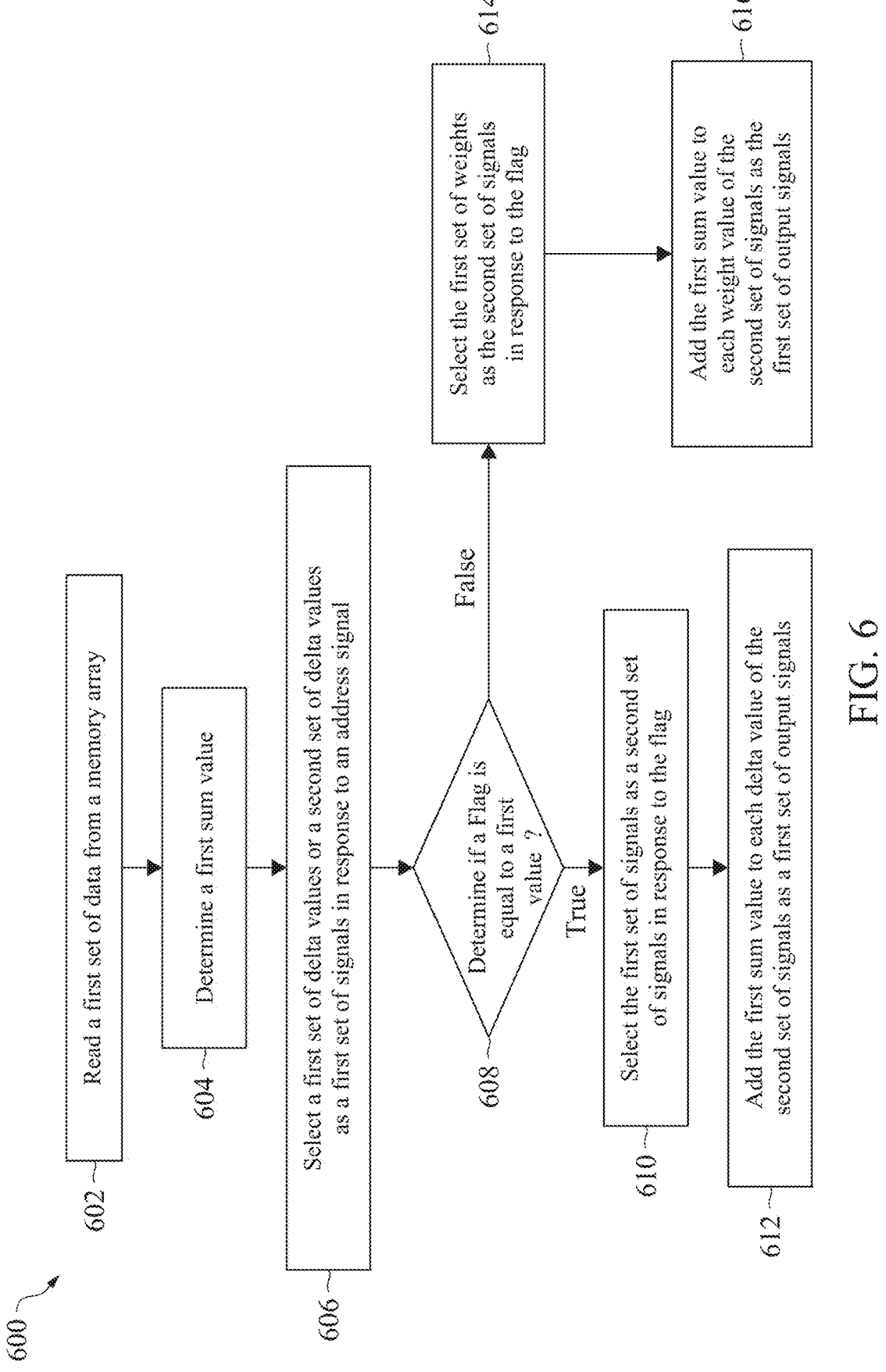
FIG. 6 is a flowchart of a method of operating a memory circuit, in accordance with some embodiments.

FIG. 6 is a flowchart of a method 600 of operating a memory circuit, in accordance with some embodiments.

In some embodiments, FIG. 6 is a flowchart of a method of operating one or more of decoder 106 of FIG. 1, decoder 800A of FIG. 8A or decoder 800C of FIG. 8C. In some embodiments, FIG. 6 is a flowchart of a method of operating memory circuit 100 of FIG. 1 or IC device 900C of FIG. 9C. It is understood that additional operations may be performed before, during, and/or after the method 600 depicted in FIG. 6, and that some other operations may only be briefly described herein. In some embodiments, other order of operations of method 600 is within the scope of the present disclosure. In some embodiments, one or more operations of method 600 are not performed.

Method 600 includes exemplary operations, but the operations are not necessarily performed in the order shown. Operations may be added, replaced, changed order, and/or eliminated as appropriate, in accordance with the spirit and scope of disclosed embodiments. It is understood that method 600 utilizes features of one or more of 106 of FIG. 1 or decoder 800A of FIG. 8A or decoder 800C of FIG. 8C.

It is understood that method 600 utilizes features of one or more of memory circuit 100 of FIG. 1, memory circuit 200 of FIG. 2, memory circuit 300 of FIG. 3, number 400 of FIG. 4, diagram 500B of FIG. 5B, diagram 700A of FIG. 7A, diagram 700B of FIG. 7B or diagram 800B of FIG. 8B.

In some embodiments, method 600 is repeated for each set of weights W. For example, if the set of weights W includes the first set of weights W1 and the second set of weights W2, then method 600 is performed for the first set of weights W1 with the first set of deltas D1 and the second set of deltas D2 (shown in FIGS. 8A-8C), and method 600 is performed for the second set of weights W2 with the first set of deltas D1 and the second set of deltas D2 (shown in FIGS. 8A-8C).

In operation 602 of method 600, a first set of data is read from a memory array.

In some embodiments, the first set of data is read by at least one of decoder 106, the set of adders 308, the set of multipliers 310, or decoder 800A, decoder 800C or memory controller 920.

In some embodiments, the first set of data of method 600 includes the set of signals FP2.

In some embodiments, the first set of data of method 600 includes the set of weights W or the set of deltas D.

In some embodiments, the first set of data of method 600 includes at least one of the first set of weights W1 or the second set of weights W2.

In some embodiments, the first set of data of method 600 includes at least one of the first set of deltas D1 or the second set of deltas D2.

In some embodiments, the memory array of method 600 includes CIM array 104, memory cell array 210AR, memory array 304, memory array 306, memory region 710, memory region 720, or diagram 800B.

In some embodiments, the first set of data of method 600 is shown as the set of weights 520 in FIG. 5B.

In some embodiments, the first set of data of method 600 is shown as the set of deltas 540 in FIG. 5B.

In some embodiments, the first set of data of method 600 is shown as deltas D1(0), ... , D1(15) of the first set of deltas D1 in FIGS. 8A-8B.

In some embodiments, the first set of data of method 600 is shown as deltas D2(0), ... , D2(15) of the first set of deltas D2 in FIGS. 8A-8B.

In some embodiments, the first set of data of method 600 is shown as weights W(0), ... , W(15) of the set of weights W1 in FIGS. 8A-8B.

In operation 604 of method 600, a first sum value FSV is determined in response to the first set of input signals XIN and the first base value BV of the first set of weights W1. In some embodiments, the first sum value FSV is equal to a sum of the first set of input signals XIN and the first base value BV of the first set of weights W1.

In some embodiments, operation 604 of method 600 is performed by a first set of adders. In some embodiments, the first set of adders of method 600 includes a set of adders 802.

In some embodiments, the first set of input signals of method 600 includes the set of input signals XIN.

In some embodiments, the first set of weights of method 600 includes the first set of weights W1.

In operation 606 of method 600, the first set of deltas D1 or the second set of deltas D2 is selected as a first set of signals C in response to an address signal ADDR.

In some embodiments, operation 606 is performed by a first set of multiplexers. In some embodiments, the first set of multiplexers of operation 606 includes a set of multiplexers 810. In some embodiments, the first set of signals C is output by the first set of multiplexers.

In some embodiments, the address signal ADDR is useable by the first set of multiplexers as a select signal to select the first set of deltas D1 or the second set of deltas D2 as an output signal (e.g., the first set of signals C).

In some embodiments, the second set of deltas D2 is a compressed version of the second set of weights W2.

In operation 608 of method 600, a determination is made if a Flag F is equal to a first value FV. In some embodiments, the flag F is a single bit. In some embodiments, the flag F is more than a single bit.

In some embodiments, the first value FV is a single bit. In some embodiments, the first value FV is more than a single bit.

In some embodiments, the first value FV is equal to a logically high (e.g., logic 1). In some embodiments, the first value FV is equal to a logically low (e.g., logic 0).

In some embodiments, the flag is useable by a second set of multiplexers (e.g., set of multiplexers 814) as a select signal.

In some embodiments, if the flag F is equal to the first value FV, then the result of operation 608 is a "True", and method 600 proceeds to operation 610.

In some embodiments, if the flag F is not equal to the first value FV, then the result of operation 608 is a "False", and method 600 proceeds to operation 614.

In operation 610 of method 600, the first set of signals C is selected as a second set of signals B in response to the flag F.

In some embodiments, at least one of operation 610 or 614 is performed by a second set of multiplexers. In some embodiments, the second set of multiplexers of method 600 includes a set of multiplexers 814. In some embodiments, the second set of signals B is output by the second set of multiplexers.

In some embodiments, the second set of signals B includes the first set of signals C or the first set of weights W1.

In some embodiments, the flag F is useable by the second set of multiplexers as a select signal to select the second set of signals B or the first set of weights W1 as an output signal (e.g., the second set of signals B).

In some embodiments, execution of operation 610 is attributed to the first set of weights W1 being previously compressed by a compressor (e.g., encoder 102), and therefore the first set of deltas D1 or the second set of deltas D2 are decompressed.

In operation 612 of method 600, the first sum value FSV is added to each delta value of the second set of signals B as a first set of output signals. Stated differently, in operation 612, the first set of output signals is determined by adding the first sum value FSV to each delta value of the second set of signals B. In some embodiments, operation 612 includes determining the first set of output signals by adding the first sum value FSV to each delta value of the first set of deltas D1 or the second set of deltas D2.

In some embodiments, operation 612 of method 600 is performed by a second set of adders. In some embodiments, the second set of adders of method 600 includes a set of adders 804.

In some embodiments, the first set of output signals of method 600 includes the set of exponent output signals DE.

In operation 614 of method 600, the first set of weights W1 is selected as the second set of signals B in response to the flag F.

In some embodiments, execution of operation 614 is attributed to the first set of weights W1 not being compressed by a compressor (e.g., encoder 102), and therefore the first set of weights W1 are not decompressed.

In operation 616 of method 600, the first sum value FSV is added to each weight value of the second set of signals B as the first set of output signals. Stated differently, in operation 616, the first set of output signals is determined by adding the first sum value FSV to each weight value of the second set of signals B. In some embodiments, operation 616 includes determining the first set of output signals by adding the first sum value FSV to each weight value of the first set of weights W1.

In some embodiments, operation 616 of method 600 is performed by the second set of adders.

By operating at least method 600, the memory circuit operates to achieve one or more benefits within the present application.

FIGS. 7A-7B is a corresponding block diagram of a corresponding diagram 700A-700B, in accordance with some embodiments.

FIGS. 7A-7B are simplified for the purpose of illustration. In some embodiments, diagram 700A or 700B includes various elements in addition to those depicted in FIGS. 7A-7B or is otherwise arranged to perform the operations discussed below.

Diagram 700A is an embodiment of one or more rows of memory array 304 of FIG. 3, and similar detailed description is therefore omitted.

Diagram 700A includes memory array 304.

Diagram 700A further includes a region 710.

In some embodiments, region 710 is an embodiment of one or more rows of memory array 304, and similar detailed description is therefore omitted.

In some embodiments, region 710 corresponds to one or more rows of memory array 304 after execution of operation 512 of method 500 of FIG. 5A.

In some embodiments, region 710 corresponds to one or more rows of memory array 304 before execution of operation 602 of method 600 of FIG. 6.

Region 710 includes a flag field 712, a base value field 714 and a data field 716.

In some embodiments, the flag field 712 is the flag F of FIGS. 6, 8A, 8B and 8C, the base value field 714 is the base value BV of FIGS. 5A, 5B, 6, 8A, 8B and 8C, and the data field 716 is the set of deltas D, and similar detailed description is therefore omitted.

In some embodiments, the flag field 712 is 1 bit in length. In some embodiments, the flag field 712 is more than 1 bit in length.

In some embodiments, the base value field 714 or the base value BV is 8 bits in length. In some embodiments, the base value field 714 or the base value BV is more than 8 bits in length. In some embodiments, the base value field 714 or the base value BV is less than 8 bits in length.

In some embodiments, the data field 716 is 128 bits in length. In some embodiments, the data field 716 is more than 128 bits in length. In some embodiments, the data field 716 is less than 128 bits in length.

In some embodiments, the data field 716 includes the first set of deltas D1 (750a) and the second set of deltas D2 (750b).

In some embodiments, the first set of deltas D1 (750a) includes delta value D1(0), D1(1), . . . , D1(15). In some embodiments, the first set of deltas D1 (750a) includes 16 delta values. Other number of values for the first set of deltas D1 (750a) is within the scope of the present disclosure.

In some embodiments, the second set of deltas D2 (750b) includes delta value D2(0), D2(1), . . . , D2(15). In some embodiments, the second set of deltas D2 (750b) includes 16 delta values. Other number of values for the second set of deltas D2 (750b) is within the scope of the present disclosure.

In some embodiments, each delta value D1(0), D1(1), . . . , D1(15) in the first set of deltas D1 is 4 bits in length. Other number of bits for each delta value D1(0), D1(1), . . . , D1(15) in the first set of deltas D1 is within the scope of the present disclosure.

In some embodiments, each delta value D2(0), D2(1), . . . , D2(15) in the second set of deltas D2 is 4 bits in length. Other number of bits for each delta value D2(0), D2(1), . . . , D2(15) in the second set of deltas D2 is within the scope of the present disclosure.

Other configurations in diagram 700A are within the scope of the present disclosure.

FIG. 7B is a block diagram of diagram 700B, in accordance with some embodiments.

Diagram 700B is an embodiment of one or more rows of memory array 304 of FIG. 3, and similar detailed description is therefore omitted.

Diagram 700B includes memory array 304.

Diagram 700B further includes a region 720.

In some embodiments, region 720 is an embodiment of one or more rows of memory array 304, and similar detailed description is therefore omitted.

In some embodiments, region 720 corresponds to one or more rows of memory array 304 after execution of operation 512 of method 500 of FIG. 5A.

In some embodiments, region 720 corresponds to one or more rows of memory array 304 before execution of operation 602 of method 600 of FIG. 6.

Region 720 includes flag field 712, base value field 714 and a data field 730.

In some embodiments, the data field 730 is the set of weights W, and similar detailed description is therefore omitted.

In some embodiments, the data field 730 is 128 bits in length. In some embodiments, the data field 730 is more than 128 bits in length. In some embodiments, the data field 730 is less than 128 bits in length.

In some embodiments, the data field 730 includes the set of weights W. In some embodiments, the data field 730 includes the first set of weights W1 or the second set of weights W2.

In some embodiments, the set of weights W includes weight values W(0), W(1), . . . , W(15). In some embodiments, the set of weights W includes 16 weight values. Other number of values for the set of weights W is within the scope of the present disclosure.

In some embodiments, the first set of weights W1 includes weight values W1(0), W1(1), . . . , W1(15). In some embodiments, the first set of weights W1 includes 16 weight values. Other number of values for the first set of weights W1 is within the scope of the present disclosure.

In some embodiments, the second set of weights W2 includes weight values W2(0), W2(1), . . . , W2(15). In some embodiments, the second set of weights W2 includes 16 weight values. Other number of values for the second set of weights W2 is within the scope of the present disclosure.

In some embodiments, each weight value W(0), W(1), . . . , W(15) in the set of weights W is 8 bits in length. Other number of bits for each weight value W(0), W(1), . . . , W(15) in the set of weights W is within the scope of the present disclosure.

Other configurations in diagram 700B are within the scope of the present disclosure.

FIG. 8A is a circuit diagram of a decoder circuit 800A, in accordance with some embodiments.

Decoder circuit 800A is an embodiment of decoder 106 of FIG. 1, and similar detailed description is therefore omitted. Decoder circuit 800A is an embodiment of at least the set of adders 308 of FIG. 3, and similar detailed description is therefore omitted. In some embodiments, decoder 800A is an embodiment of adder tree 210AT of FIG. 2, and similar detailed description is therefore omitted.

FIG. 8A is simplified for the purpose of illustration. In some embodiments, decoder circuit 800A includes various elements in addition to those depicted in FIG. 8A or is otherwise arranged to perform the operations discussed below.

Decoder circuit 800A comprises a set of adders 802, a set of multiplexers 810, a set of registers 812 and a set of multiplexers 814 and a set of adders 804.

The set of adders 802 is coupled to the set of adders 804. The set of multiplexers 810 is coupled to the set of registers 812 and the set of multiplexers 814. The set of registers 812 and the set of multiplexers 814 are coupled to the set of adders 804.

The set of adders 802 is configured to receive the set of input signals XIN and the first base value BV of the first set of weights W1 or the second set of weights W2. The set of adders 802 is configured to output the first sum value FSV to the set of adders 804. The set of adders 802 is configured to generate the first sum value FSV in response to the set of input signals XIN and the first base value BV of the first set of weights W1 or the second set of weights W2. In some embodiments, the set of adders 802 is configured to determine the first sum value FSV in response to the set of input signals XIN and the first base value BV of the first set of weights W1 or the second set of weights W2. In some embodiments, the first base value of the first set of weights W1 or the second set of weights W2 is a minimum value in the first set of weights W1 or the second set of weights W2. In some embodiments, determination of the first sum value FSV by the set of adders 802 is performed for each first base value BV of the first set of weights W1 or the second set of weights W2.

In some embodiments, the set of adders 802 is configured to perform at least operation 604 of method 600, and similar detailed description is therefore omitted.

In some embodiments, a first input terminal of the set of adders 802 is coupled to a source of the input signal XIN, a second input terminal of the set of adders 802 is coupled to a source of the first base value (e.g., CIM memory array 104 of FIG. 1, memory array 210AR of FIG. 2 or memory array 304 of FIG. 3). In some embodiments, an output terminal of the set of adders 802 is coupled to a first set of input terminals of the set of adders 804. In some embodiments, the output terminal of the set of adders 802 is configured to output the first sum value FSV to the first set of input terminals of the set of adders 804.

In some embodiments, the set of adders 804 includes at least adder 804a. Other number of adders in the set of adders 804 is within the scope of the present disclosure.

Other configurations of the set of adders 804 are within the scope of the present disclosure.

The set of multiplexers 810 is coupled to the CIM memory array 104 of FIG. 1, memory array 210AR of FIG. 2 or memory array 304 of FIG. 3, and similar detailed description is therefore omitted.

In some embodiments, the set of multiplexers 810 is configured to perform at least operation 606 and 608 of method 600, and similar detailed description is therefore omitted.

The set of multiplexers 810 is configured to receive the first set of deltas D1, the second set of deltas D2 and the address signal ADDR. The set of multiplexers 810 is configured to output the set of signals C in response to the address signal ADDR. In some embodiments, the address signal ADDR is useable by the set of multiplexers 810 to select the first set of deltas D1 or the second set of deltas D2 as the set of signals C.

In some embodiments, the set of signals C is either the first set of deltas D1 or the second set of deltas D2 based on a value of the address signal ADDR.

In some embodiments, the set of signals C is equal to the first set of deltas D1 when the address signal ADDR is equal to a logically low (e.g., logic 0). In some embodiments, the set of signals C is equal to the second set of deltas D2 when the address signal ADDR is equal to a logically high (e.g., logic 1).

In some embodiments, the set of multiplexers 810 includes at least one of multiplexer 810(0), 810(1), . . . , 810(15). Other number of multiplexers in the set of multiplexers 810 is within the scope of the present disclosure.

In some embodiments, the set of signals C includes at least one of signal C[0], C[1], . . . , C[15]. Other number of signals in the set of signals C is within the scope of the present disclosure.

In some embodiments, each multiplexer 810(0), 810(1), . . . , 810(15) of the set of multiplexers 810 is configured to receive a corresponding delta value D1[0], D1[1], . . . , D1[15] of the first set of deltas D1, a corresponding delta value D2[0], D2[1], . . . , D2[15] of the second set of deltas D2 and the address signal ADDR.

In some embodiments, each multiplexer 810(0), 810(1), . . . , 810(15) of the set of multiplexers 810 is configured to output a corresponding signal C[0], C[1], . . . , C[15] of the set of signals C in response to the address signal ADDR.

In some embodiments, each signal C[0], C[1], . . . , C[15] of the set of signals C is equal to a corresponding delta value D1[0], D1[1], . . . , D1[15] of the first set of deltas D1 or a corresponding delta value D2[0], D2[1], . . . , D2[15] of the second set of deltas D2 based on the address signal ADDR.

Other configurations of the address signal ADDR are within the scope of the present disclosure. For example, in some embodiments, the set of signals C is equal to the first set of deltas D1 when the address signal ADDR is equal to a logically high (e.g., logic 1). For example, in some embodiments, the set of signals C is equal to the second set of deltas D2 when the address signal ADDR is equal to a logically low (e.g., logic 0).

In some embodiments, the first set of deltas D1 is equal to a difference between the first base value BV of the first set of weights W1 and the first set of weights W1.

In some embodiments, the second set of deltas D2 is equal to a difference between a second base value BV of a second set of weights W2 and the second set of weights W2. In some embodiments, the second base value of the second set of weights W2 is a minimum value in the second set of weights W2.

Other configurations of the set of multiplexers 810 are within the scope of the present disclosure.

A first set of input terminals of the set of registers 812 is coupled to a source of a tied low signal TIEL. In some embodiments, the tied low signal TIEL is a signal that includes 4 bits of a logically low (e.g., logic 0) signal. Other number of bits in the tied low signal TIEL is within the scope of the present disclosure. In some embodiments, the tied low signal TIEL is a signal that includes one or more bits of a logically high (e.g., logic 1) signal.

A second set of input terminals of the set of registers 812 is coupled to the output terminal of the set of multiplexers 810. An output terminal of the set of registers 812 is configured to output a set of signals PD. The set of registers 812 is configured to generate the set of signals PD. In some embodiments, the set of signals PD is a combination of the tied low signal TIEL and the set of signals C. In some embodiments, the set of signals PD is a zero padded version of the set of signals C having a same length as the first set of weights W1 or the second set of weights W2. For example, if the first set of weights W1 or the second set of weights W2 has a length equal to 8 bits, then the set of signals PD has a length equal to 8 bits, in accordance with some embodiments. In this example, if the set of signals C has a length equal to 4 bits, then the tied low signal TIEL has a length equal to 4 bits since 8-4 is equal to 4 bits, in accordance with some embodiments. In this example, if the set of signals C has a length equal to 5 bits, then the tied low signal TIEL has a length equal to 3 bits since 8-5 is equal to 3 bits, in accordance with some embodiments.

In some embodiments, the tied low signal TIEL is useable by the set of registers to pad a sequence or a number of zeros added to a front end of the set of signals C in generating the set of signals PD.

In some embodiments, the set of registers 812 includes at least one of register 812(0), 812(1), . . . , 812(15). Other number of registers in the set of registers 812 is within the scope of the present disclosure.

In some embodiments, at least one of register 812(0), 812(1), . . . , 812(15) of the set of registers 812 is a shift register. In some embodiments, at least one of register 812(0), 812(1), . . . , 812(15) of the set of registers 812 is a memory element configured to store at least a bit of data. In some embodiments, at least one of register 812(0), 812(1), . . . , 812(15) of the set of registers 812 is a memory cell configured to store at least a bit of data.

In some embodiments, the set of signals PD includes at least one of signal PD[0], PD[1], . . . , PD[15]. Other number of signals in the set of signals PD is within the scope of the present disclosure.

In some embodiments, each register 812(0), 812(1), . . . , 812(15) of the set of registers 812 is configured to receive a corresponding signal of the tied low signal TIEL or a corresponding signal C[0], C[1], . . . , C[15] of the set of signals C.

In some embodiments, each register 812(0), 812(1), . . . , 812(15) of the set of registers 812 is configured to output a corresponding signal PD[0], PD[1], . . . , PD[15] of the set of signals PD.

In some embodiments, signal PD[0], PD[1], . . . , PD[15] of the set of signals PD is equal to a corresponding signal of the tied low signal TIEL or a corresponding signal C[0], C[1], . . . , C[15] of the set of signals C.

Other configurations of the set of registers 812 are within the scope of the present disclosure.

The set of multiplexers 814 is coupled to the set of registers 814 and the CIM memory array 104 of FIG. 1, memory array 210AR of FIG. 2 or memory array 304 of FIG. 3, and similar detailed description is therefore omitted.

In some embodiments, the set of multiplexers 814 is configured to perform at least operation 610 or 614 of method 600, and similar detailed description is therefore omitted.

The set of multiplexers 814 is configured to receive the set of signals PD, the first set of weights W1 and the flag signal F. The set of multiplexers 814 is configured to output the set of signals B in response to the flag signal F. In some embodiments, the flag signal F is useable by the set of multiplexers 814 to select the set of signals PD or the first set of weights W1 as the set of signals B.

In some embodiments, the set of signals B is either the set of signals PD or the first set of weights W1 as the set of signals B based on a value of the flag signal F.

In some embodiments, the set of signals B is equal to the set of signals PD when the flag signal F is equal to a logically high (e.g., logic 1). In some embodiments, the set of signals B is equal to the first set of weights W1 when the flag signal F is equal to a logically low (e.g., logic 0).

In some embodiments, the set of multiplexers 814 includes at least one of multiplexer 814(0), 814(1), . . . , 814(15). Other number of multiplexers in the set of multiplexers 814 is within the scope of the present disclosure.

In some embodiments, the set of signals B includes at least one of signal B[0], B[1], . . . , B[15]. Other number of signals in the set of signals B is within the scope of the present disclosure.

In some embodiments, each multiplexer 814(0), 814(1), . . . , 814(15) of the set of multiplexers 814 is configured to receive a corresponding signal PD[0], PD[1], . . . , PD[15] of the set of signals PD, a corresponding weight value W[0], W[1], . . . , W[15] of the first set of weights W1 and the flag signal F.

In some embodiments, each multiplexer 814(0), 814(1), . . . , 814(15) of the set of multiplexers 814 is configured to output a corresponding signal B[0], B[1], . . . , B[15] of the set of signals B in response to the flag signal F.

In some embodiments, each signal B[0], B[1], . . . , B[15] of the set of signals B is equal to a corresponding signal PD[0], PD[1], . . . , PD[15] of the set of signals PD or a corresponding weight value W[0], W[1], . . . , W[15] of the first set of weights W1 based on the flag signal F.

Other configurations of the flag signal F are within the scope of the present disclosure. For example, in some embodiments, the set of signals B is equal to the set of signals PD when the flag signal F is equal to a logically low (e.g., logic 0). For example, in some embodiments, the set of signals B is equal to the first set of weights W1 when the flag signal F is equal to a logically high (e.g., logic 1) signal.

Other configurations of the set of multiplexers 814 are within the scope of the present disclosure.

The set of adders 804 is coupled to the set of adders 802 and the set of multiplexers 814.

In some embodiments, the set of adders 804 is further coupled to the CIM memory array 104 of FIG. 1, memory array 210AR of FIG. 2 or memory array 304 of FIG. 3, and similar detailed description is therefore omitted.

The set of adders 804 is configured to receive the first sum value FSV and the set of signals B. The set of adders 804 is configured to output the set of output exponent signals DE. The set of adders 804 is configured to generate the set of output exponent signals DE in response to the set of signals B and the first sum value FSV. In some embodiments, the set of adders 804 is configured to determine the set of output exponent signals DE in response to the set of signals B and the first sum value FSV. In some embodiments, the set of output exponent signals DE is a sum of the set of signals B and the first sum value FSV.

In some embodiments, the set of adders 804 is configured to perform at least operation 612 or 616 of method 600, and similar detailed description is therefore omitted.

In some embodiments, the set of adders 804 includes at least one of adder 804(0), 804(1), . . . , 804(15). Other number of adders in the set of adders 804 is within the scope of the present disclosure.

In some embodiments, the set of output exponent signals DE includes at least one of output exponent signal DE(0), DE(1), . . . , DE(X) of the set of output exponent signals DE. Other number of output exponential signals in the set of output exponent signals DE is within the scope of the present disclosure.

In some embodiments, an input terminal of corresponding adder 804(0), 804(1), . . . , 804(15) of the set of adders 814 is coupled to a corresponding output terminal of corresponding multiplexer 814(0), 814(1), . . . , 814(15) of the set of multiplexers 814, and the output terminal of the set of adders 804.

In some embodiments, each adder 804(0), 804(1), . . . , 804(15) of the set of adders 814 is configured to receive a corresponding signal B[0], B[1], . . . , B[15] of the set of signals B and the first sum value FSV.

In some embodiments, each adder 804(0), 804(1), . . . , 804(15) of the set of adders 814 is configured to output a corresponding output exponent signal DE(0), DE(1), . . . , DE(X) of the set of output exponent signals DE in response to the corresponding signal B[0], B[1], . . . , B[15] of the set of signals B and the first sum value FSV.

In some embodiments, each output exponent signal DE(0), DE(1), . . . , DE(X) of the set of output exponent signals DE is equal to a corresponding sum of the corresponding signal B[0], B[1], . . . , B[15] of the set of signals B and the first sum value FSV.

Other configurations of the set of adders 804 are within the scope of the present disclosure.

Other configurations of decoder circuit 800A are within the scope of the present disclosure. FIG. 8B is a block diagram of a diagram 800B, in accordance with some embodiments.

In some embodiments, a portion 802 of diagram 800B is an embodiment of one or more rows of memory array 304 of FIG. 3, and similar detailed description is therefore omitted.

Diagram 800B includes an input data field 808, an address field 810, a flag field 812, a base value field 814 and a data field 816.

In some embodiments, the input data field 808 is the input signal XIN of FIGS. 1, 3, 6, 8A, 8B and 8C, the address field 810 is the address signal ADDR of FIGS. 6, 8A, 8B and 8C, the flag field 812 is the flag F of FIGS. 6, 8A, 8B and 8C, the base value field 814 is the base value BV of FIGS. 5A, 5B, 6, 8A, 8B and 8C, and the data field 816 is the set of deltas D, and similar detailed description is therefore omitted.

In some embodiments, the input data field 808 is 8 bits in length. In some embodiments, the input data field 808 is different from 8 bits in length.

In some embodiments, the address field 810 is 1 bit in length. In some embodiments, the address field 810 is more than 1 bit in length.

In some embodiments, the flag field 812 is 1 bit in length. In some embodiments, the flag field 812 is more than 1 bit in length.

In some embodiments, the base value field 814 or the base value BV is 8 bits in length. In some embodiments, the base value field 814 or the base value BV is more than 8 bits in length. In some embodiments, the base value field 814 or the base value BV is less than 8 bits in length.

In some embodiments, the data field 816 is 128 bits in length. In some embodiments, the data field 816 is more than 128 bits in length. In some embodiments, the data field 816 is less than 128 bits in length.

In some embodiments, the data field 816 includes the first set of deltas D1.

In some embodiments, the first set of deltas D1 includes delta value D1(0), D1(1), . . . , D1(15). In some embodiments, the first set of deltas D1 includes 16 delta values. Other number of values for the first set of deltas D1 is within the scope of the present disclosure.

In some embodiments, each delta value D1(0), D1(1), . . . , D1(15) in the first set of deltas D1 is 4 bits in length. Other number of bits for each delta value D1(0), D1(1), . . . , D1(15) in the first set of deltas D1 is within the scope of the present disclosure.

Other configurations in diagram 800B are within the scope of the present disclosure.

FIG. 8C is a diagram 800C of a graphical illustration of at least part of method 600 of FIG. 6, in accordance with some embodiments.

In some embodiments, diagram 800C corresponds to a graphical illustration of determining the set of exponent output signals DE applied to the decoder circuit 800A of FIG. 8A, and similar detailed description is therefore omitted.

FIG. 8C is simplified for the purpose of illustration.

Diagram 800C comprises the decoder circuit 800A of FIG. 8A and the values of FIG. 800B of FIG. 8B when applied to the decoder circuit 800A of FIG. 8A.

For example, in some embodiments, when the input signal XIN is 15, and the first base value BV is 13, then the first sum value FSV (e.g., the output signal of the set of adders 802) is equal to 28.

For example, in these embodiments, when the address signal ADDR is 0 or logically low, then the set of multiplexers 810 is configured to output the first set of deltas D1 as the set of signals C. For example, in these embodiments, when the address signal ADDR is 0 or logically low, then multiplexer 810(0), . . . , 810(15) of the set of multiplexers 810 is configured to output corresponding signal D1[0], . . . , D[15] as corresponding signal C[0], . . . , C[15] of the set of signals C. For example, in these embodiments, signal C[0] is equal to 2, and signal C[15] is equal to 4.

In these embodiments, when the set of weight signals W1 is equal to 8 bits in length, and the first set of deltas D1 is equal to 4 bits in length, then the tie low signal is 4 bits in length, and has a value of 0000. In these embodiments, when signal C[0] is equal to 2, and signal C[15] is equal to 4, then the corresponding register 812(0), . . . , 812(15) of the set of registers 812 is configured to output corresponding signal PD[0] equal to 2, . . . , and signal PD[15] equal to 4.

For example, in these embodiments, when the flag signal F is 1 or logically high, then the set of multiplexers 814 is configured to output corresponding signal PD[0], . . . , PD[15] of the set of signals PD as the set of signals B. For example, in these embodiments, when the flag signal F is 1 or logically high, then multiplexer 812(0), . . . , 812(15) of the set of multiplexers 812 is configured to output corresponding signal PD[0], . . . , PD[15] as corresponding signal B[0], . . . , B[15] of the set of signals B. For example, in these embodiments, signal B[0] is equal to 2, and signal B[15] is equal to 4.

For example, in these embodiments, when the first sum value FSV (e.g., the output signal of the set of adders 802) is 28, and when signal B[0] is equal to 2, and signal B[15] is equal to 4, then the output exponent signal DE[0], . . . , DE[15] of the set of output exponent signals DE is equal to 30, . . . , 32.

Other values or configurations of diagram 800C are within the scope of the present disclosure.

Figure 9A:
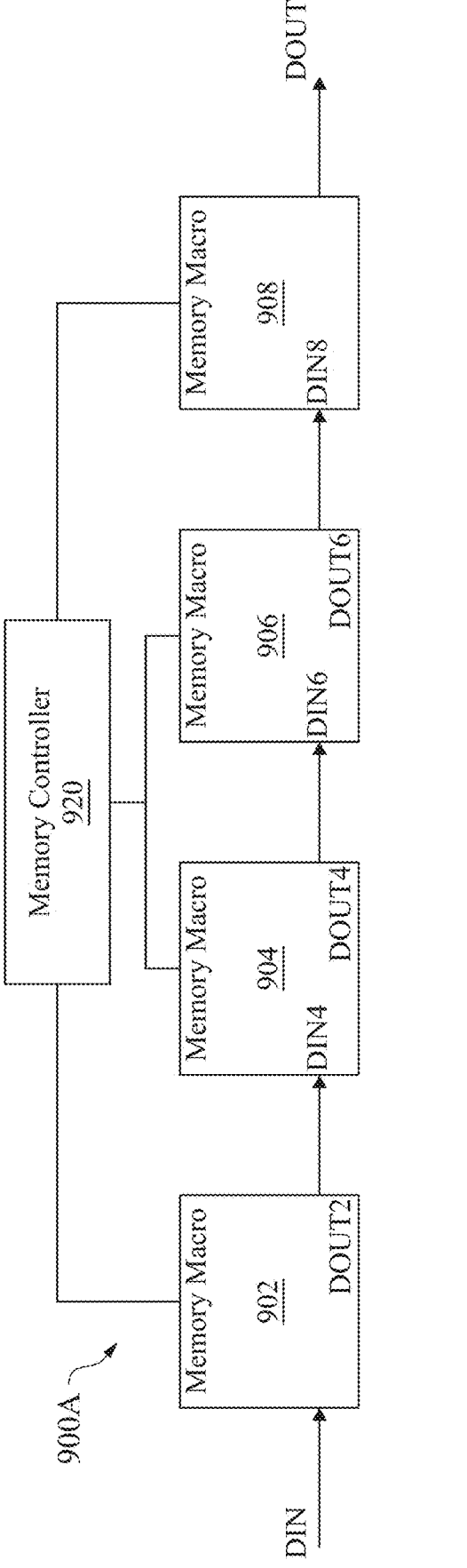
FIG. 9A is a schematic diagram of a memory device, in accordance with some embodiments.

FIG. 9A is a schematic diagram of a memory device 900A, in accordance with some embodiments.

The memory device 900A comprises memory macros 902, 904, 906, 908 and memory controller 920. In some embodiments, one or more of the memory macros 902, 904, 906, 908 correspond to memory macro 110, and/or memory controller 920 corresponds to the encoder 102. In some embodiments, one or more of the memory macros 902, 904, 906, 908 correspond to the CIM memory cell array 104 and/or the decoder 106, and/or memory controller 920 corresponds to the encoder 102.

In the example configuration in FIG. 9A, the memory controller 920 is a common memory controller for the memory macros 902, 904, 906, 908. In at least one embodiment, at least one of the memory macros 902, 904, 906, 908 has its own memory controller. The number of four memory macros in the memory device 900A is an example. Other configurations are within the scopes of various embodiments.

The memory macros 902, 904, 906, 908 are coupled to each other in sequence, with output data of a preceding memory macro being input data for a subsequent memory macro. For example, input data DIN are input into the memory macro 902. The memory macro 902 performs one or more CIM operations based on the input data DIN and one of the weight data of the set of weights W or the set of deltas 716 (shown in FIG. 7A) stored in the memory macro 902, and generates output data DOUT2 as results of the CIM operations. The output data DOUT2 are supplied as input data DIN4 of the memory macro 904. The memory macro 904 performs one or more CIM operations based on the input data DIN4 and one of the weight data of the set of weights W or the set of deltas 716 (shown in FIG. 7A) stored in the memory macro 904, and generates output data DOUT4 as results of the CIM operations. The output data DOUT4 are supplied as input data DIN6 of the memory macro 906. The memory macro 906 performs one or more CIM operations based on the input data DIN6 and one of the weight data of the set of weights W or the set of deltas 716 (shown in FIG. 7A) stored in the memory macro 906, and generates output data DOUT6 as results of the CIM operations. The output data DOUT6 are supplied as input data DIN8 of the memory macro 908. The memory macro 908 performs one or more CIM operations based on the input data DIN8 and one of the weight data of the set of weights W or the set of deltas 716 (shown in FIG. 7A) stored in the memory macro 908, and generates output data DOUT as results of the CIM operations.

One or more of the input data DIN, DIN4, DIN6, DIN8 correspond to the set of data FP1 described with respect to FIG. 1, and/or one or more of the output data DOUT2, DOUT4, DOUT6, DOUT correspond to the set of output data D_OUT described with respect to FIG. 1, and similar detailed description is therefore omitted. In at least one embodiment, the described configuration of the memory macros 902, 904, 906, 908 implements a neural network. In at least one embodiment, one or more advantages described herein are achievable by the memory device 900A.

Other configurations or quantities of elements in memory device 900A are within the scope of the present disclosure.

Figure 9B:
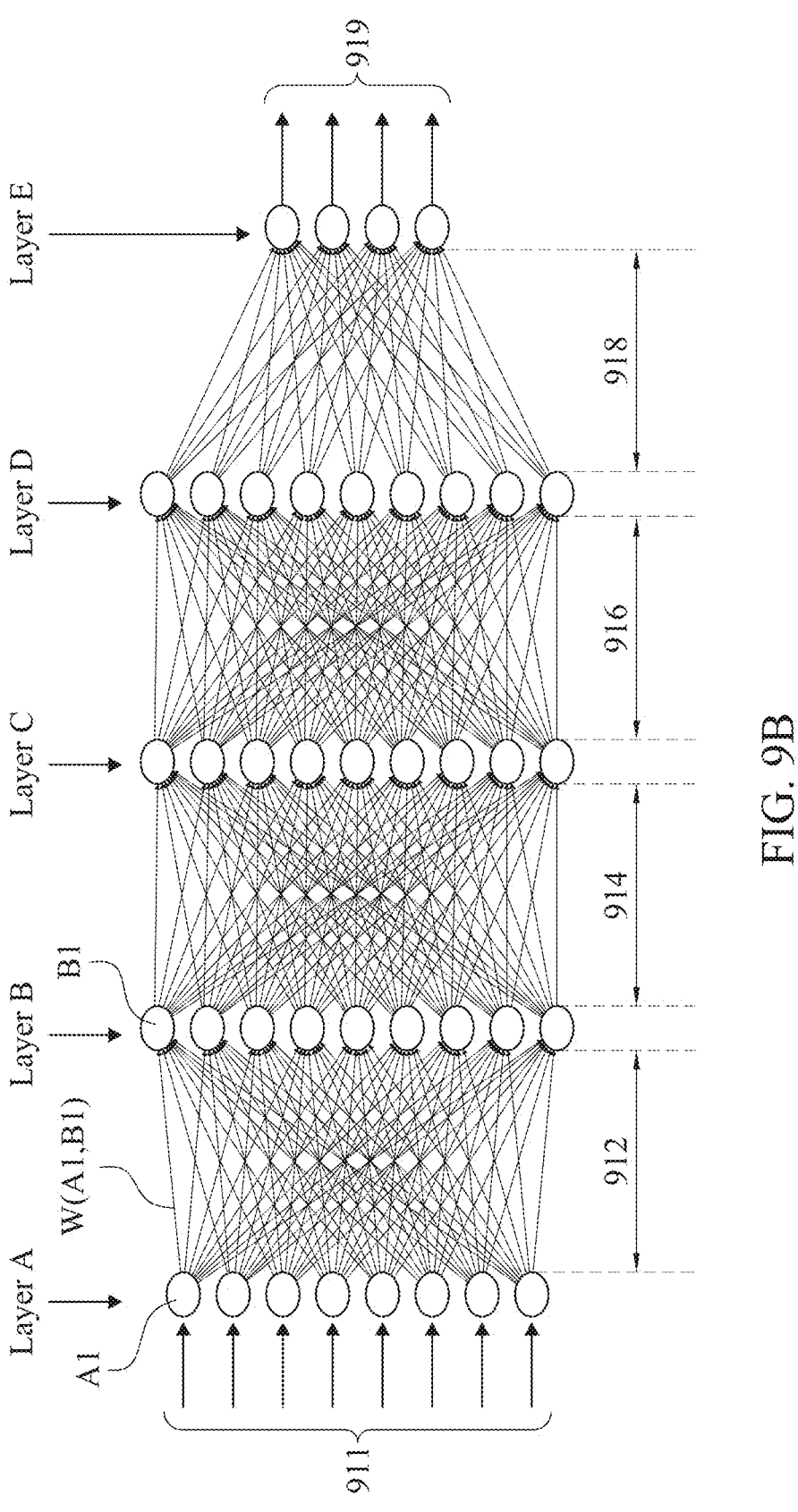
FIG. 9B is a schematic diagram of a neural network, in accordance with some embodiments.

FIG. 9B is a schematic diagram of a neural network 900B, in accordance with some embodiments.

The neural network 900B comprises a plurality of layers A-E each comprising a plurality of nodes (or neurons). The nodes in successive layers of the neural network 900B are connected with each other by a matrix or array of connections. For example, the nodes in layers A and B are connected with each other by connections in a matrix 912, the nodes in layers B and C are connected with each other by connections in a matrix 914, the nodes in layers C and D are connected with each other by connections in a matrix 916, and the nodes in layers D and E are connected with each other by connections in a matrix 918. Layer A is an input layer configured to receive input data 911. The input data 911 propagate through the neural network 900B, from one layer to the next layer via the corresponding matrix of connections between the layers. As the data propagate through the neural network 900B, the data undergo one or more computations, and are output as output data 919 from layer E which is an output layer of the neural network 900B. Layers B, C, D between input layer A and output layer E are sometimes referred to as hidden or intermediate layers. The number of layers, number of matrices of connections, and number of nodes in each layer in FIG. 9B are examples. Other configurations are within the scopes of various embodiments. For example, in at least one embodiment, the neural network 900B includes no hidden layer, and has an input layer connected by one matrix of connections to an output layer. In one or more embodiments, the neural network 900B has one, two, or more than three hidden layers.

In some embodiments, the matrices 912, 914, 916, 918 are correspondingly implemented by the memory macros 902, 904, 906, 908, the input data 911 corresponds to the input data DIN, and the output data 919 corresponds to the output data DOUT, and similar detailed description is therefore omitted. Specifically, in the matrix 912, a connection between a node in layer A and another node in layer B has a corresponding weight. For example, a connection between node A1 and node B1 has a weight W(A1,B1) which corresponds to a weight value of the set of weights W or the set of deltas 716 (shown in FIG. 7A) stored in the memory array of the memory macro 902. The memory macros 904, 906, 908 are configured in a similar manner. The weight data of the set of weights W or the set of deltas 716 (shown in FIG. 7A) in one or more of the memory macros 902, 904, 906, 908 are updated, e.g., by a processor and through the memory controller 920, as machine learning is performed using the neural network 900B. One or more advantages described herein are achievable in the neural network 900B implemented in whole or in part by one or more memory macros and/or memory devices in accordance with some embodiments.

Other configurations or quantities of elements in neural network 900B are within the scope of the present disclosure.

Figure 9C:
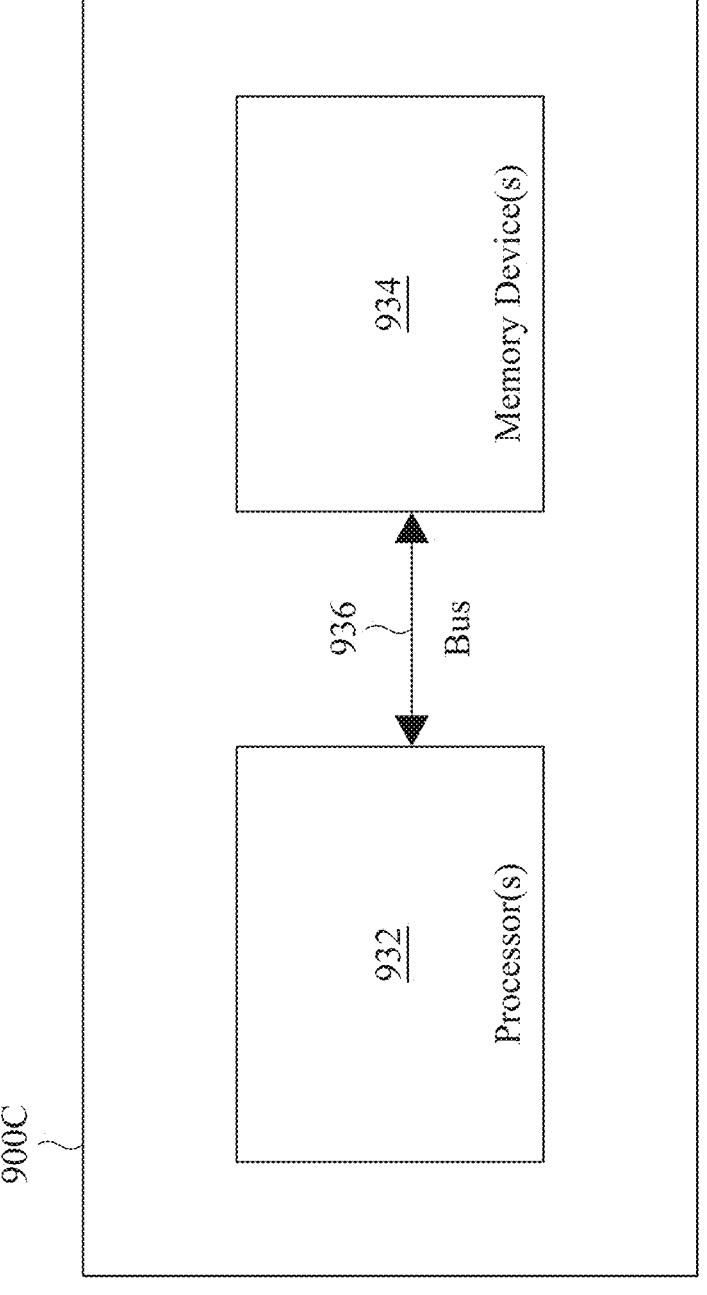
FIG. 9C is a schematic diagram of an integrated circuit (IC) device, in accordance with some embodiments.

FIG. 9C is a schematic diagram of an integrated circuit (IC) device 900C, in accordance with some embodiments.

The IC device 900C is an embodiment of memory device 100 of FIG. 1 or memory device 900A of FIG. 9A, and similar detailed description is therefore omitted.

The IC device 900C comprises one or more hardware processors 932, one or more memory devices 934 coupled to the processors 932 by one or more buses 936. In some embodiments, the one or more hardware processors 932 is useable as one or more components in encoder 102 of FIG. 1 or memory controller 920 in FIG. 9A, and similar detailed description is therefore omitted. In some embodiments, the one or more memory devices 934 is useable as one or more components in memory circuit 102 of FIG. 1, memory macro 110 of FIG. 1 or one or more of memory macros 902, 904, 906 or 908 in FIG. 9A, and similar detailed description is therefore omitted.

In some embodiments, the IC device 900C comprises one or more further circuits including, but not limited to, cellular transceiver, global positioning system (GPS) receiver, network interface circuitry for one or more of Wi-Fi, USB, Bluetooth, or the like. Examples of the processors 932 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 934 include one or more memory devices and/or memory macros described herein. In at least one embodiment, each of the processors 932 is coupled to a corresponding memory device among the memory devices 934.

Because the one or more of the memory devices 934 are CIM memory devices, various computations are performed in the memory devices which reduces the computing workload of the corresponding processor, reduces memory access time, and improves performance. In at least one embodiment, the IC device 900C is a system-on-a-chip (SOC). In at least one embodiment, one or more advantages described herein are achievable by the IC device 900C.

Other configurations or quantities of elements in IC device 900C are within the scope of the present disclosure.

In some embodiments, at least a portion of method 500A is implemented as a standalone software application for execution by a processor. In some embodiments, at least a portion of method 500A is implemented as a software application that is a part of an additional software application. In some embodiments, at least a portion of method 500A is implemented as a plug-in to a software application. In some embodiments, at least a portion of method 500A is implemented as a software application that is a portion of a neural network tool. In some embodiments, at least a portion of method 500A is implemented as a software application that is used by a neural network tool.

In some embodiments, one or more of the operations of method 500A or 600 is not performed. Furthermore, various logic circuits shown in FIGS. 1-9C are for illustration purposes. Embodiments of the disclosure are not limited to a particular logic circuits, and one or more of the logic circuits shown in FIGS. 1-9C can be substituted with a one or more corresponding logic circuits of a different function or an equivalent function. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of logic circuits in FIGS. 1-9C is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a memory cell array configured to store a first set of data, the first set of data including a first set of weights or a second set of data, the first set of data being exponent portions of corresponding floating point numbers, the second set of data being a compressed version of the first set of weights, the first set of weights has a first data length, and the second set of data has a second data length less than the first data length. In some embodiments, the CIM array includes a decoder coupled to the memory cell array, and being configured to generate a first set of output signals in response to a first set of input signals, the first set of data and a flag signal.

Another aspect of this description relates a memory circuit. The memory circuit includes a compute in-memory (CIM) array. In some embodiments, the CIM array includes a memory cell array configured to store a first set of exponent data and a first set of mantissa data, the first set of exponent data including a first set of weights or a second set of exponent data, the first set of exponent data being exponent portions of corresponding floating point numbers, and the second set of exponent data being a compressed version of the first set of weights, the first set of mantissa data being a second set of weights, and the first set of mantissa data being mantissa portions of the corresponding floating point numbers. In some embodiments, the CIM array further includes a first adder circuit coupled to the memory cell array, and being configured to generate a first set of output signals in response to a first set of input signals, the first set of exponent data and a flag signal. In some embodiments, the CIM array further includes a set of multipliers coupled to the memory cell array, and being configured to generate a second set of output signals in response to the first set of input signals and the first set of mantissa data.

Still another aspect of this description relates to a method of operating a memory circuit. In some embodiments, the method includes receiving, by an encoder a first set of weights, the first set of weights being in a floating point number format. In some embodiments, the method further includes compressing, by the encoder, the first set of weights to a first set of delta signals, the first set of weights including a first data length, the first set of delta signals including a second data length less than the first data length. In some embodiments, the method further includes performing, by a compute in-memory array (CIM), a read operation of a memory cell array in the CIM array thereby outputting the first set of delta signals, the CIM array being coupled to the encoder. In some embodiments, the method further includes generating, by a decoder, a first set of output signals in response to a first set of input signals and the first set of delta signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a compute in-memory (CIM) array comprising:
a memory cell array configured to store a first set of data, the first set of data including a first set of weights or a second set of data, the first set of data being exponent portions of corresponding floating point numbers, the second set of data being a compressed version of the first set of weights, the first set of weights has a first data length, and the second set of data has a second data length less than the first data length; and
a decoder coupled to the memory cell array, and being configured to generate a first set of output signals in response to a first set of input signals, the first set of data and a flag signal.

2. The memory circuit of claim 1, wherein the decoder comprises:
a first adder coupled to the memory cell array, being configured to receive the first set of input signals and a first base value of the first set of weights, and being configured to determine a first sum value in response to the first set of input signals and the first base value of the first set of weights, wherein the first base value of the first set of weights is a minimum value in the first set of weights.

3. The memory circuit of claim 2, wherein the decoder further comprises:
a first set of multiplexers coupled to the memory cell array, the first set of multiplexers being configured to receive a first set of delta signals, a second set of delta signals and an address signal, and being configured to output a first set of signals in response to the address signal,
wherein the first set of delta signals is the second set of data;
the first set of delta signals is equal to a difference between the first base value of the first set of weights and the first set of weights;

the second set of delta signals is equal to a difference between a second base value of a second set of weights and the second set of weights, wherein the second base value of the second set of weights is a minimum value in the second set of weights; and
the address signal is useable by the first set of multiplexers to select the first set of delta signals or the second set of delta signals as the first set of signals.

4. The memory circuit of claim 3, wherein the decoder further comprises:
a first set of registers coupled to the first set of multiplexers, the first set of registers being configured to receive the first set of signals and the first set of input signals, and being configured to output a second set of signals, wherein the second set of signals is a combination of the first set of input signals and the first set of signals, and is a zero padded version of the first set of signals having a same length as the first set of weights.

5. The memory circuit of claim 4, wherein the first set of input signals is a sequence of logic 0s.

6. The memory circuit of claim 4, wherein the decoder further comprises:
a second set of multiplexers coupled to the memory cell array and the first set of registers, the second set of multiplexers being configured to receive the second set of signals, the first set of weights and the flag signal, and being configured to output a third set of signals in response to the flag signal,
wherein the flag signal is useable by the second set of multiplexers to select the second set of signals or the first set of weights as the third set of signals.

7. The memory circuit of claim 6, wherein the decoder further comprises:
a first set of adders coupled to the memory cell array, the first adder and the second set of multiplexers, the first set of adders being configured to receive the first sum value and the third set of signals, and being configured to generate the first set of output signals, the first set of output signals being a sum of the first sum value and the third set of signals,
wherein each output signal of the first set of output signals is equal to a corresponding sum of the first sum value and a corresponding signal of the third set of signals.

8. The memory circuit of claim 1, further comprising:
an encoder coupled to the CIM array, and being configured to receive the first set of weights, and being configured to generate the first set of data.

9. The memory circuit of claim 1, wherein the CIM array further comprises:
a set of multipliers coupled to the memory cell array, and being configured to multiply a mantissa portion of the first set of data and the first set of input signals.

10. A memory circuit, comprising:
a compute in-memory (CIM) array comprising:
a memory cell array configured to store a first set of exponent data and a first set of mantissa data, the first set of exponent data including a first set of weights or a second set of exponent data, the first set of exponent data being exponent portions of corresponding floating point numbers, and the second set of exponent data being a compressed version of the first set of weights, the first set of mantissa data being a second set of weights, and the first set of mantissa data being mantissa portions of the corresponding floating point numbers;
a first adder circuit coupled to the memory cell array, and being configured to generate a first set of output signals in response to a first set of input signals, the first set of exponent data and a flag signal; and a set of multipliers coupled to the memory cell array, and being configured to generate a second set of output signals in response to the first set of input signals and the first set of mantissa data.

11. The memory circuit of claim 10, wherein the first set of output signals is equal to a sum of the first set of input signals and the first set of exponent data; and the second set of output signals is equal to a product of the first set of input signals and the first set of mantissa data.

12. The memory circuit of claim 10, wherein the first adder circuit comprises:

a first adder coupled to the memory cell array, being configured to receive the first set of input signals and a first base value of the first set of weights, and being configured to determine a first sum value in response to the first set of input signals and the first base value of the first set of weights, wherein the first base value of the first set of weights is a minimum value in the first set of weights.

13. The memory circuit of claim 12, wherein the first adder circuit further comprises:

a first set of multiplexers coupled to the memory cell array, the first set of multiplexers being configured to receive a first set of delta signals, a second set of delta signals and an address signal, and being configured to output a first set of signals in response to the address signal, wherein the first set of delta signals is the second set of exponent data;

the first set of delta signals is equal to a difference between the first base value of the first set of weights and the first set of weights;

the second set of delta signals is a third set of exponent data;

the second set of delta signals is equal to a difference between a second base value of a second set of weights and the second set of weights, wherein the second base value of the second set of weights is a minimum value in the second set of weights; and the address signal is useable by the first set of multiplexers to select the first set of delta signals or the second set of delta signals as the first set of signals.

14. The memory circuit of claim 13, wherein the first adder circuit further comprises:

a first set of registers coupled to the first set of multiplexers, the first set of registers being configured to receive the first set of signals and the first set of input signals, and being configured to output a second set of signals, wherein the second set of signals is a combination of the first set of input signals and the first set of signals, and is a zero padded version of the first set of signals having a same length as the first set of weights.

15. The memory circuit of claim 14, wherein the first set of input signals is a sequence of logic 0s.

16. The memory circuit of claim 14, wherein the first adder circuit further comprises:

a second set of multiplexers coupled to the memory cell array and the first set of registers, the second set of multiplexers being configured to receive the second set of signals, the first set of weights and the flag signal, and being configured to output a third set of signals in response to the flag signal, wherein the flag signal is useable by the second set of multiplexers to select the second set of signals or the first set of weights as the third set of signals.

17. The memory circuit of claim 16, wherein the first adder circuit further comprises:

a first set of adders coupled to the memory cell array, the first adder and the second set of multiplexers, the first set of adders being configured to receive the first sum value and the third set of signals, and being configured to generate the first set of output signals, the first set of output signals being a sum of the first sum value and the third set of signals, wherein each output signal of the first set of output signals is equal to a corresponding sum of the first sum value and a corresponding signal of the third set of signals.

18. A method of operating a memory circuit, the method comprising:

receiving, by an encoder a first set of weights, the first set of weights being in a floating point number format;

compressing, by the encoder, the first set of weights to a first set of delta signals, the first set of weights including a first data length, the first set of delta signals including a second data length less than the first data length;

performing, by a compute in-memory (CIM) array, a read operation of a memory cell array in the CIM array thereby outputting the first set of delta signals, the CIM array being coupled to the encoder; and generating, by a decoder, a first set of output signals in response to a first set of input signals and the first set of delta signals.

19. The method of claim 18, wherein compressing the first set of weights to the first set of delta signals comprises:

receiving, by a controller, the first set of weights;

determining a first base value of the first set of weights, the first base value is a minimum value of the first set of weights;

determining the first set of deltas from the first base value of the first set of weights and the first set of weights, the first set of deltas being equal to a difference between the first base value and the first set of weights;

determining a maximum delta value in the first set of deltas; and at least:

writing the first set of deltas to the memory cell array in response to the maximum delta value in the first set of deltas being greater than a first threshold; or writing the first set of weights to the memory cell array in response to the maximum delta value in the first set of deltas being less than the first threshold.

20. The method of claim 19, wherein generating the first set of output signals in response to the first set of input signals and the first set of delta signals comprises:

determining, by a first set of adders, a first sum value in response to the first set of input signals and the first base value of the first set of weights;

selecting, by a first set of multiplexers, the first set of delta values or a second set of delta values as a first set of signals in response to an address signal, the second set of delta values being a compressed version of a second set of weights; and in response to determining that a flag is equal to a first value, selecting, by a second set of multiplexers, the first set of signals as a second set of signals in response to the flag; and adding, by a second set of adders, the first sum value to each delta value of the second set of signals as a first set of output signals; or in response to determining that the flag is not equal to the first value, selecting, by the second set of multiplexers, the first set of weight signals as the second set of signals in response to the flag; and adding, by the second set of adders, the first sum value to each weight value of the second set of signals as the first set of output signals.

* * * * *